(12) United States Patent
Shiga et al.

(10) Patent No.: US 6,240,019 B1
(45) Date of Patent: May 29, 2001

(54) NON-VOLATILE SEMICONDUCTOR MEMORY DEVICE HAVING A FUNCTION FOR CONTROLLING THE RANGE OF DISTRIBUTION OF MEMORY CELL THRESHOLD VOLTAGES

(75) Inventors: Hitoshi Shiga, Yokohama; Toru Tanzawa, Ebina; Masanobu Saito, Chiba, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/471,489

(22) Filed: Dec. 23, 1999

(30) Foreign Application Priority Data

Dec. 25, 1998 (JP) .................................. 10-370760
Dec. 6, 1999 (JP) .................................. 11-346557

(51) Int. Cl.[7] .................................. G11C 16/06
(52) U.S. Cl. .................................. 365/185.22; 365/185.2
(58) Field of Search .......................... 365/185.22, 185.2, 365/185.19

(56) References Cited

U.S. PATENT DOCUMENTS 5,568,419  10/1996  Atsumi et al. .................... 365/185.3
5,677,869  10/1997  Fazio et al. ....................... 365/185.03
5,946,231  * 8/1999  Endoh ............................. 365/185.03

OTHER PUBLICATIONS

IEDM Tech. Digest, "A Self–Convergence Erasing Scheme for a Simple Stacked Gate Flash EEPROM" pp. 307–310, Dec. 1991, YAMADA, et al.

* cited by examiner

Primary Examiner—A. Zarabian
(74) Attorney, Agent, or Firm—Banner & Witcoff, Ltd.

(57) ABSTRACT

A non-volatile semiconductor memory device according to the invention comprises a memory cell array having a plurality of non-volatile memory cells, and a write state machine controlling a voltage applied to a memory cell selected from the memory cell array and a voltage application period, in accordance with each of reading of data from the selected memory cell, writing of data into the selected memory cell, and erasure of data from the selected memory. The write state machine executes writing, under a first writing condition, on a predetermined number of memory cells included in the memory cell array, and executes writing on memory cells other than the predetermined number of memory cells, under a second writing condition set in accordance with a result of the writing executed under the first writing condition.

24 Claims, 20 Drawing Sheets

| | CELL 1 | CELL 2 | CELL 3 |
|---|---|---|---|
| 0th | OK | NG | NG |
| FIRST | OK | OK | NG |
| SECOND | OK | OK | NG |
| THIRD | OK | OK | OK |

| D/A CONVERTER INPUT VALUE | | | | D/A CONVERTER OUTPUT VALUE Vg |
|---|---|---|---|---|
| D | C | B | A | |
| 1 | 1 | 1 | 1 | 9.5 (V) |
| 1 | 1 | 1 | 0 | 9.0 |
| 1 | 1 | 0 | 1 | 8.5 |
| 1 | 1 | 0 | 0 | 8.0 |
| 1 | 0 | 1 | 1 | 7.5 |
| 1 | 0 | 1 | 0 | 7.0 |
| 1 | 0 | 0 | 1 | 6.5 |
| 1 | 0 | 0 | 0 | 6.0 |
| 0 | 1 | 1 | 1 | 5.5 |
| 0 | 1 | 1 | 0 | 5.0 |
| 0 | 1 | 0 | 1 | 4.5 |
| 0 | 1 | 0 | 0 | 4.0 |
| 0 | 0 | 1 | 1 | 3.5 |
| 0 | 0 | 1 | 0 | 3.0 |
| 0 | 0 | 0 | 1 | 2.5 |
| 0 | 0 | 0 | 0 | 2.0 |
FIG. 16
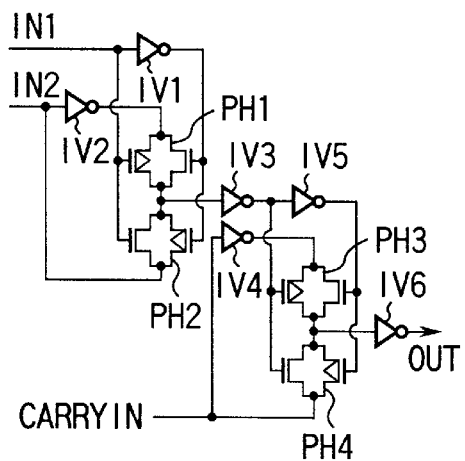
FIG. 17A
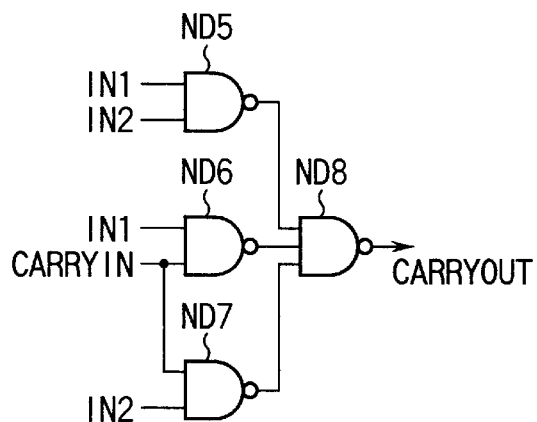
FIG. 17B

| AVERAGE OF NUMBERS OF WEAK PROGRAMMING OPERATIONS | INPUT SIGNAL IN2 TO ADDER | | | | INCREASE ΔVg |
|---|---|---|---|---|---|
| 0  | 0 | 0 | 0 | 0 | 0  (V) |
| 1  | 0 | 0 | 0 | 0 | 0 |
| 2  | 0 | 0 | 0 | 1 | 0.5 |
| 3  | 0 | 0 | 0 | 1 | 0.5 |
| 4  | 0 | 0 | 1 | 0 | 1.0 |
| 5  | 0 | 0 | 1 | 0 | 1.0 |
| 6  | 0 | 0 | 1 | 1 | 1.5 |
| 7  | 0 | 0 | 1 | 1 | 1.5 |
| 8  | 0 | 1 | 0 | 0 | 2.0 |
| 9  | 0 | 1 | 0 | 0 | 2.0 |
| 10 | 0 | 1 | 0 | 1 | 2.5 |
| 11 | 0 | 1 | 0 | 1 | 2.5 |
| 12 | 0 | 1 | 1 | 0 | 3.0 |
| 13 | 0 | 1 | 1 | 0 | 3.0 |
| 14 | 0 | 1 | 1 | 1 | 3.5 |
| 15 | 0 | 1 | 1 | 1 | 3.5 |
| 16 | 1 | 0 | 0 | 0 | 4.0 |

FIG. 18

NON-VOLATILE SEMICONDUCTOR MEMORY DEVICE HAVING A FUNCTION FOR CONTROLLING THE RANGE OF DISTRIBUTION OF MEMORY CELL THRESHOLD VOLTAGES

BACKGROUND OF THE INVENTION

This invention relates to a non-volatile semiconductor memory device, and more particularly to a NOR-type flash memory having a function for controlling the range of distribution of the threshold voltages of memory cells obtained after data erasure.

In NOR-type flash memory devices, reduction of the voltage of a power supply and increase of reading speed are demanded. To realize this simultaneously, it is important to minimize the range of distribution of the threshold values of memory cells in an erased state (this distribution will be hereinafter referred to as an "erasion distribution").

To execute each-bit verification and weak programming after erasion are considered as means for reducing the range of distribution of memory cell thresholds (hereinafter referred to as "cell thresholds") in a NOR-type flash memory.

The each-bit verification indicates verification executed in units of one bit, and the weak programming is programming of a smaller amount than usual. In the weak programming, a smaller amount of bias current than in usual programming is applied to a memory cell gate or drain to thereby minimize the range of changes in threshold value.

The weak programming operation of the NOR-type flash memory will be described.

FIG. 1A shows a distribution of cell thresholds of a memory cell array after erasion. FIG. 1B shows a distribution of cell thresholds of a memory cell array after weak programming.

As is shown in FIG. 1A, erasion reduces the cell threshold values Vth to values lower than an erase verify level EV. After erasion, weak programming is executed on cells having threshold values Vth lower than an over erase verify level OEV. As a result, as is shown in FIG. 1B, the cell threshold values Vth fall within a range of from the erasion verify level EV to the over erase verify level OEV. In other words, the distribution of the cell threshold values is reduced to the range of OEV<Vth<EV.

FIG. 2 illustrates a sequence of processing for realizing a distribution range of cell threshold values Vth as shown in FIG. 1B. FIG. 2 is a flowchart useful in explaining a conventional each-bit verifying operation and weak programming operation.

First, an erasion operation is performed until the upper limit of the distribution of the cell threshold values Vth reaches the erasion verify level EV. Subsequently, to raise the lower limit of the erasion distribution of the cell threshold values Vth up to the over erase verify level OEV, each-bit verification and weak programming are performed. In the each-bit verification, the gate voltage Vg of each cell is set at OEV, all cells are sequentially subjected to verification.

If the verification result for each of cells corresponding to an address to be verified is OK (Vth≧OEV), this address is counted up, and each of cells corresponding to the next address is accessed. On the other hand, if the verification result is NG (Vth<OEV), each cell is subjected to weak programming. This verification and weak programming is repeated until the threshold value Vth of each cell exceeds OEV. After that, it is determined whether or not the verification results of all cells are OK, thereby finishing the sequence of processing.

In the weak programming, the gate voltage Vg and the drain voltage Vd of each cell and the period of programming are set so that the cell threshold value Vth will not exceed the erase verify level EV.

The period required for erasing a memory chip is defined as a period that includes a period required for cell erasion and also required for verification of each bit and weak programming to reduce the range of distribution of cell threshold values. Accordingly, the verification of each bit and weak programming must be executed within as short a period as possible, and it is desirable that the period of voltage application to each cell during weak programming should be as short (for example, 1.5 μsec.) as in usual programming.

The relationship between a period required for hot electron writing and a change in the threshold value of a memory cell in the NOR-type flash memory is usually as shown in FIG. 3. FIG. 3 shows cell writing characteristics, the ordinate and the abscissa indicating a change ΔVth (V) in the cell threshold value Vth and a writing time period (μsec.) (logarithm), respectively. In the case of FIG. 3, the drain voltage of each cell is fixed at 5V, and the gate voltage Vg applied when writing is used as a parameter.

The writing characteristics change from a linear area (≦10 μsec.) in which the cell threshold value Vth increases as the writing time period increases, to a saturated area in which the degree of an increase in the cell threshold value Vth gradually reduces.

Since the above-mentioned weak programming is executed using a short pulse of 10 μsec. or less, it has the writing characteristics of the linear area. In the writing characteristics of the linear area, a change ΔVth in the cell threshold value Vth is greatly influenced by variations in memory cells or the temperature. In particular, the change Δth greatly depends upon the temperature.

FIG. 4 shows the dependency, upon the temperature, of a writing time period required for shifting the cell threshold value Vth from 0V to 2V in the linear area of the writing characteristics shown in FIG. 3.

It is understood from the temperature dependency that where the gate voltage Vg is fixed when writing, the time required for shifting the cell threshold value Vth by 2V at 100° C. and −40° C. differs by a maximum multiple of ten.

The execution, under these circumstances, of the each-bit verification and the weak programming shown in FIG. 2 will be described.

Since the cell threshold value Vth must not exceed the erase verify level EV even after weak programming, it is necessary to set the gate voltage Vg applied when weak programming so that the cell threshold value will not exceed the erase verify level EV at a low temperature at which the writing speed is high. This setting, however, may create a case where the time required for weak programming will be, at maximum, ten times greater at a high temperature at which the writing speed is low, than at a low temperature at which the writing speed is high.

Further, the time required for each-bit verification and weak programming after data erasion varies depending upon variations between memory chips or blocks. The block is an aggregate of memory cells which can be erased simultaneously, and a minimum unit assumed when executing erasion.

In the above-described conventional non-volatile semiconductor memory, the time required for shifting the cell threshold value greatly depends upon the temperature when executing each-bit verification and weak programming after data erasion. Accordingly, the time required for each-bit verification and weak programming will inevitably be much longer at a high temperature at which the writing speed is low.

BRIEF SUMMARY OF THE INVENTION

The present invention has been developed to solve the above problem, and aims to provide a non-volatile semiconductor memory device in which, when sequentially selecting memory cells from a memory cell array to write data therein, the time required for the writing can be minimized at any optional temperature that falls within an operation-guaranteed temperature range.

To attain the aim, there is provided a non-volatile semiconductor memory device comprising: a memory cell array having a plurality of non-volatile memory cells; and a control section for controlling a voltage applied to a memory cell selected from the memory cell array and a voltage application period, in accordance with each of reading of data from the selected memory cell, writing of data into the selected memory cell, and erasion of data from the selected memory, wherein the control section changes addresses for designating memory cells in the memory cell array to sequentially selects them, the control section executing writing on memory cells under a first writing condition until a predetermined address is reached, and executing writing on memory cells under a second writing condition after the predetermined address.

When the non-volatile semiconductor memory device constructed as above sequentially selects a plurality of memory cells in a memory cell array to write data therein, it can minimize the time required for writing at any optional temperature within an operation guaranteed temperature range by changing the writing condition in different address zones of the memory cells.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 16 is a table showing the relationship between the input and output of a D/A converter appearing in FIG. 15;

FIGS. 17A and 17B are circuit diagrams showing an adder incorporated in the weak programming controller shown in FIG. 15;

FIG. 18 is a table illustrating the relationship between an input signal IN2 input to the adder incorporated in the weak programming controller and regulator shown in FIG. 15, and an increase in gate voltage Vg;

DETAILED DESCRIPTION OF THE INVENTION

The embodiments of the invention will be described with reference to the accompanying drawings.

First, the outline of the invention will be explained referring to a NOR-type flash memory as an example. In general, in the NOR-type flash memory, to narrow the range of distribution of the threshold values of memory cells in an erased state leads to high-speed reading at a low power voltage. To narrow the threshold value distribution range, each-bit verification and weak programming are executed. However, short hot electron writing of about 1 μsec. significantly depends upon temperature, which means that the time required for writing greatly differs between different temperatures.

In light of the above, in this invention, the memory cell array in one block that can be erased simultaneously is divided into a first group for which each-bit verification and weak programming are executed in a first stage, and a second group for which each-bit verification and weak programming are executed in a second stage. Each block is divided into such first and second groups. The each-bit verification and weak programming executed on the first group will be referred to as a "sample writing (first weak programming)", and the each-bit verification and weak programming executed under the second group will be referred to as a "main writing (second weak programming)".

The sample writing is executed on a predetermined small number of cells (i.e. first group cells) included in the memory cells of each block. In the sample writing, a parameter related to a writing time period (writing speed), for example, a gate voltage Vg (a word line potential) applied when writing, is set at a low value, and the number of weak programming operations during sample writing is counted.

The main writing is executed on a great number of remaining cells (i.e. second group cells) except for the first group cells. In the main writing, the value of the parameter (the gate voltage Vg, for example) is changed in accordance with the counted value of the weak programming operations during sample writing. In other words, an appropriate gate voltage Vg is selected for the present temperature.

By virtue of the above control, the time required for the each-bit verification and weak programming executed after data erasion can be minimized at an optional temperature within the operation guarantee temperature range.

[First Embodiment]

Figure 5:
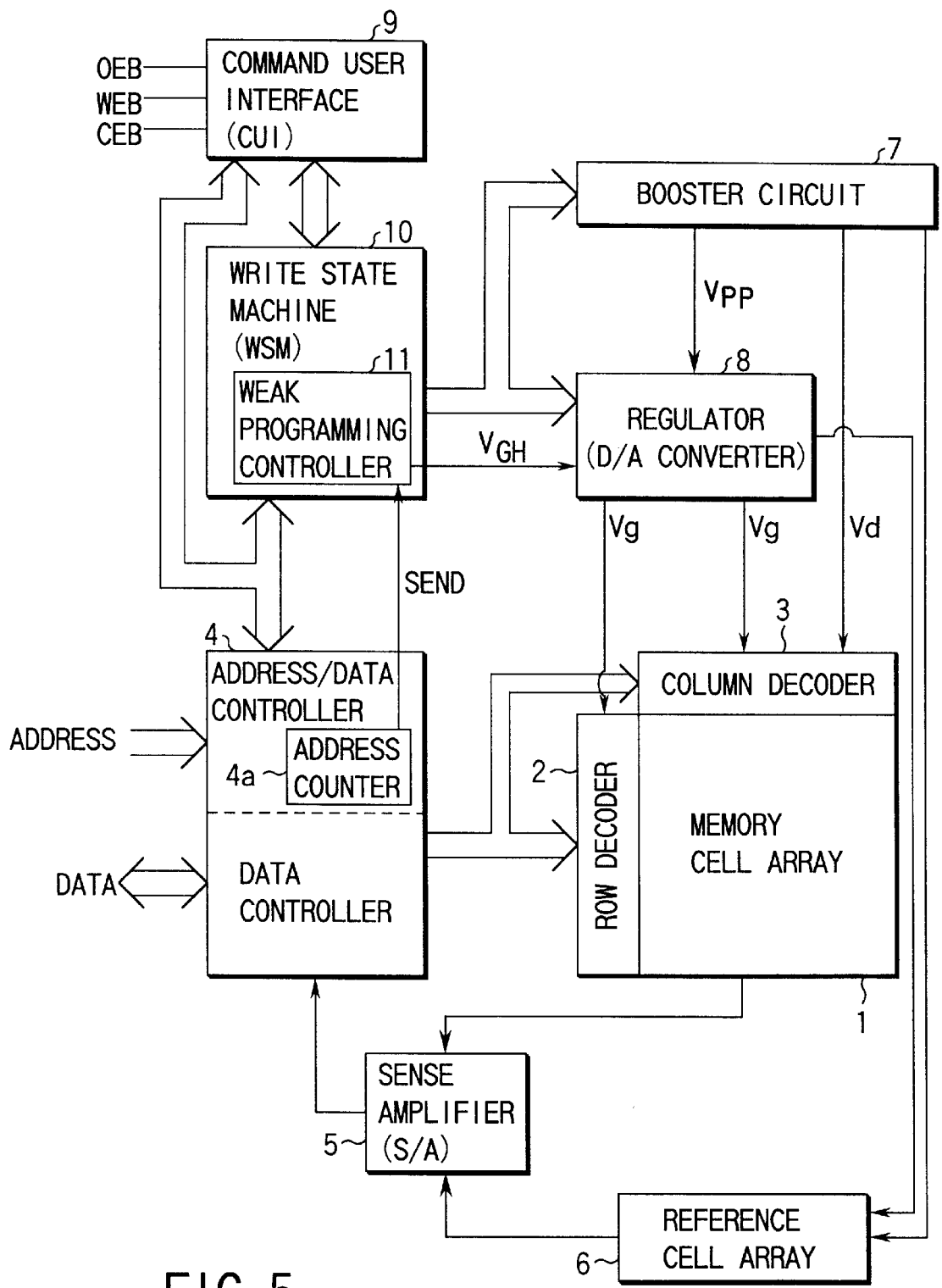
FIG. 5 is a schematic block diagram showing a NOR-type flash memory (memory chip) according to a first embodiment of the invention.

FIG. 5 is a schematic block diagram illustrating a NOR-type flash memory (memory chip) according to a first embodiment of the invention.

In FIG. 5, a memory cell array 1 comprises cell transistors constituting the memory cells of the NOR-type flash memory and arranged in rows and columns. A row decoder 2 decodes a row address designated by an address/data controller 4 which will be described later, thereby selecting a row in the memory cell array 1.

A column decoder 3 decodes a column address designated by the address/data controller, thereby selecting a column in the memory cell array 1. The column decoder 3 includes a transistor for column switching.

The address/data controller 4 is responsive to an address signal for supplying a row address and a column address to the row decoder 2 and the column decoder 3, respectively. The address/data controller 4 includes an address counter 4a.

When reading data stored in a memory cell selected from the memory cell array 1, a sense amplifier (S/A) 5 compares a reading potential from the memory cell with a reading potential from a reference cell in a reference cell array 6, and outputs a comparison result to the address/data controller 4.

A booster circuit (power supply control system) 7 supplies a drain voltage Vd to be applied to the drain of a cell transistor selected by the column decoder 3, in accordance with the reading, writing or erasing operation of the transistor. The booster circuit 7 supplies a boosted voltage Vpp to a regulator 8.

The regulator 8 receives the voltage Vpp output from the booster circuit 7 to control, on the basis of a control signal VGH, the gate voltage Vg to be applied to the gate of a cell transistor selected by the row decoder 2, and also to be applied to the gate of the column switch transistor in the column decoder 3. In this case, the regulator 8 increases the gate voltage when the control signal VGH is at an "H" level.

A command user interface (CUI) 9 determines a reading, writing or erasing command on the basis of an output enable signal OEB, a write enable signal WEB and a chip enable signal CEB input to control pins (not shown) from the outside, and predetermined signals input to an address pin (not shown) and a data pin (not shown). The command user interface 9 supplies a write state machine (WSM) 10 with a control signal based on the command.

The write state machine 10 includes a weak programming controller 11. The weak programming controller 11 counts the number of weak programming operations on the basis of a sample end signal SEND supplied from the address counter 4a of the address/data controller 4, and outputs the control signal VGH. The control signal VGH. The sample end signal SEND is a signal for informing the final address of the first group cells, which will be described later.

Figure 6:
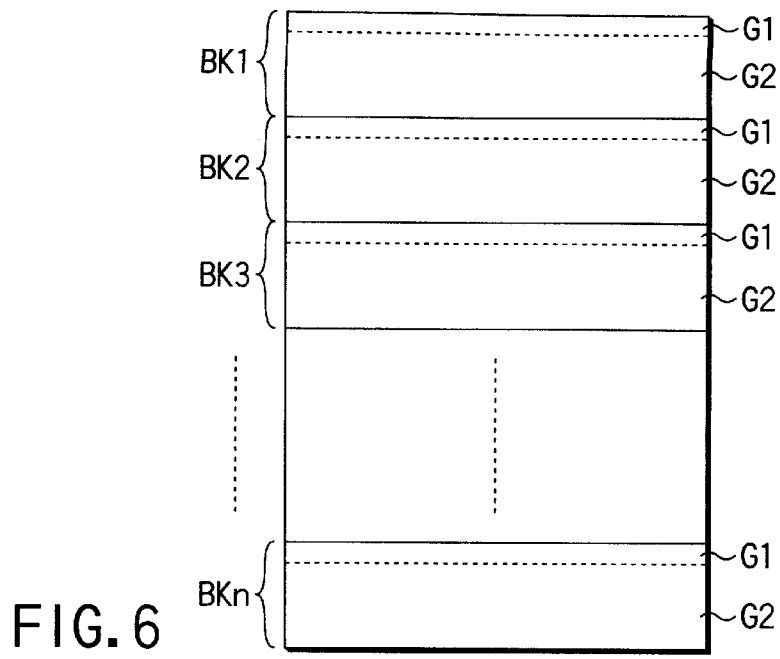
FIG. 6 is a conceptual view showing the states of first and second groups in an address space incorporated in the NOR-type flash memory.

The memory cell array 1 is divided into a plurality of blocks BK1–BKn in each of which data erasion can be simultaneously performed, as is shown in FIG. 6. Further, each of the blocks BK1–BKn is divided into a first group G1 (sample group) and a second group G2 (main group).

When executing data writing by sequentially selecting a plurality of memory cells in the memory cell array 1, the write state machine 10 performs the following control on the first and second groups G1 and G2.

First, the write state machine 10 sets, as a first writing condition, a parameter related to a writing time period (writing speed) for each cell. Subsequently, the machine 10 sequentially selects the memory cells of the first group G1 and subjects them to writing and verification. The parameter includes, for example, the gate and drain voltages applied to each cell, the voltage application period of each cell, etc. The write state machine 10 then sets a second writing condition, which is obtained by changing the voltage applied to each cell or the voltage application period of each cell in accordance with the time required for writing of all memory cells of the first group G1. The machine 10 then selects the memory cells of the second group G2 in order and subjects them to writing and verification.

Specifically, the write state machine 10 sequentially selects the memory cells of the memory cell array 1 in a determined order by changing addresses each assigned to a certain number of cells to designate them, and executes each-bit verification and writing. In each-bit verification and writing, writing operations and verifying operations to verify the writing result are repeated until memory cells of each address pass the verify test. Further, the write state machine 10 executes writing under a first writing condition until a predetermined address is reached, and executes writing under a second writing condition after the predetermined address.

The each-bit verification and writing is used to, for example, reduce the distribution range of the threshold values of cells after, for example, the data in the cells of the memory cell array are erased and then the cells pass the erase verify test.

Figure 7A:
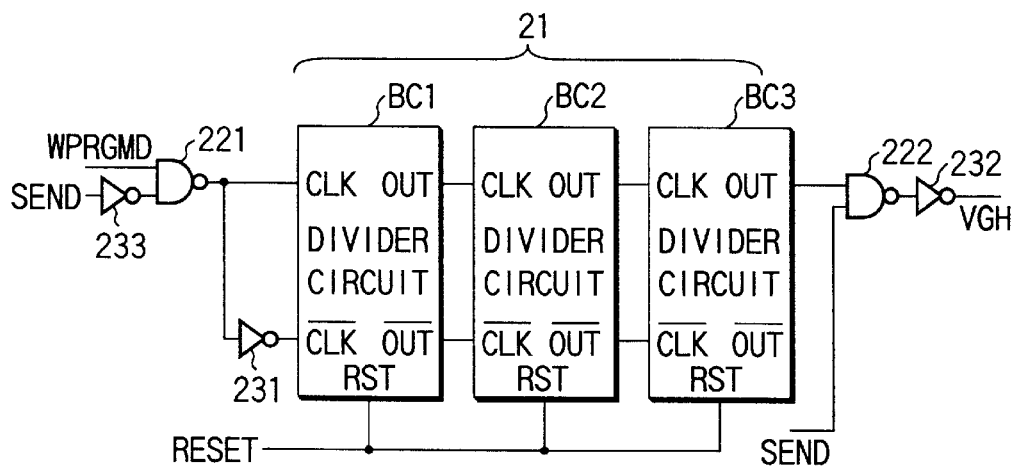
FIG. 7A is a circuit diagram illustrating a weak programming controller in the flash memory of FIG. 5.
Figure 7B:
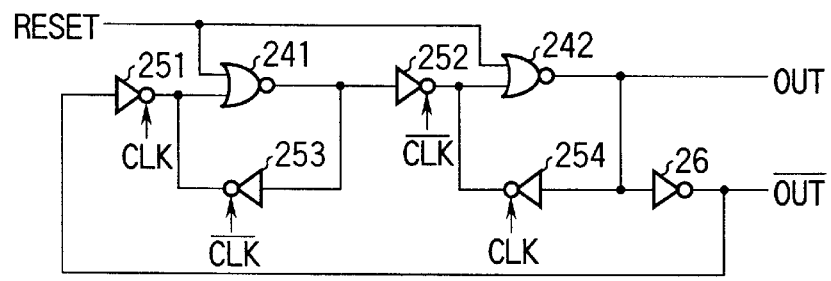
FIG. 7B is a circuit diagram illustrating a divider circuit as a first-stage divider circuit of the weak programming controller.

Referring to FIGS. 7A and 7B, the weak programming controller 11 appearing in FIG. 5 will be described.

FIG. 7A is a circuit diagram showing the structure of the weak programming controller 11.

As shown in FIG. 7A, the weak programming controller 11 comprises a binary counter 21 consisting of divider circuits BC1–BC3 that are arranged in three stages, NAND gates 221 and 222 each having two input terminals, and three inverters 231, 232 and 233.

FIG. 7B is a circuit diagram showing one of the divider circuits BC1–BC3 of FIG. 7A, which have the same structure.

The divider circuit consists of a master-slave type flip-flop (F/F) circuit. In this circuit, NOR gates 241 and 242 each having two input terminals, four clock inverters 251–254 and an inverter 26 are connected as shown in FIG. 7B. The operation of such a flip-flop (F/F) circuit is well known, and no detailed description will be given thereof.

In FIG. 7A, a weak programming signal WPRGMD is at an "H" level when executing weak programming, and is used to instruct execution of weak programming. This signal is supplied from another circuit (not shown). A sample end signal SEND is used to inform the final address of the first group G1 and output from the address counter 4a in the address/data controller 4. The signal SEND is at an "L" level during sample writing, i.e. while the address counter 4a counts the number of weak programming operations on a predetermined small number of cells (first group cells). After the sample writing, the signal SEND becomes an "H" level. A signal RESET is used to reset the divider circuit and supplied from another circuit (not shown) to a reset terminal RST of each divider circuit BC1, BC2 or BC3.

As is shown in FIG. 7A, a signal obtained by inverting the signal SEND by the inverter 233 and the signal WPRGMD are input to the NAND gate 221. The output signal of the NAND gate and a signal obtained by inverting this signal by the inverter 231 are input to complementary clock input terminals CLK and /CLK of the first-stage divider circuit BC1 of the binary counter 21, respectively.

The output signal of one of the complementary signal output terminals of the final-stage divider circuit BC3 of the binary counter 21, and the sample end signal SEND are input to the NAND gate 222. Further, the output signal of the NAND gate is inverted by the inverter 232 and supplied as the control signal VGH to the regulator 8 shown in FIG. 5. The control signal VGH is used to control the gate voltage Vg to an appropriate value.

The binary counter 21 counts the number of weak programming operations performed while the sample end signal SEND is at the "L" level. Until the count value reaches a predetermined value, a signal output from the output terminal OUT of the binary counter 21 is kept at the "L" level, which means that the control signal VGH is kept at the "L" level.

After the count value of the binary counter 21 reaches a predetermined value, the signal output from the output terminal OUT of the binary counter 21 becomes the "H" level, which means that the control signal VGH becomes the "H" level.

Figure 8A:
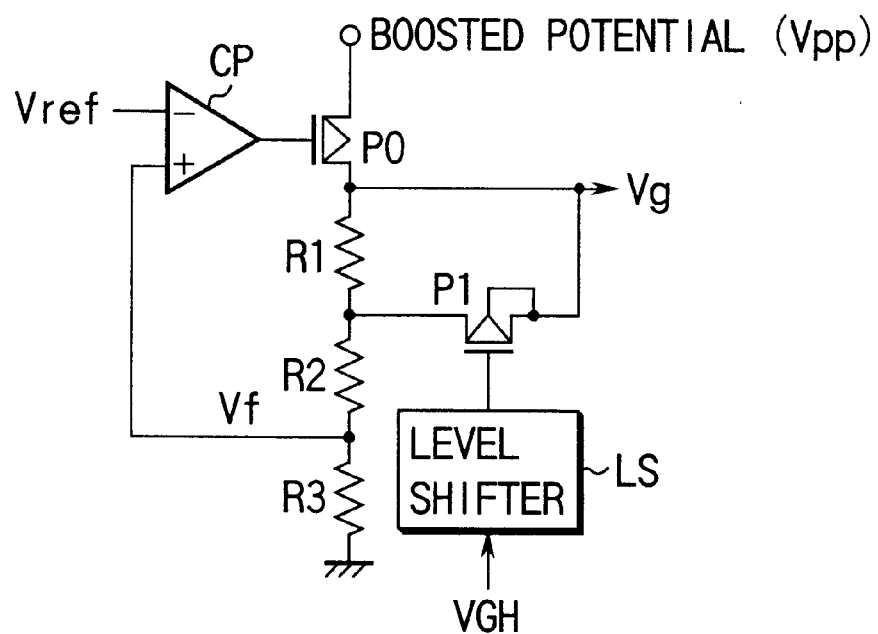
FIG. 8A is a circuit diagram illustrating a D/A converter used as an example of a regulator in the flash memory of FIG. 5.
Figure 8B:
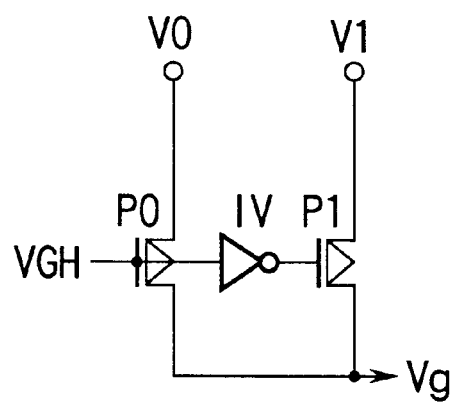
FIG. 8B is a circuit diagram showing a voltage switching circuit used as another example of the regulator.

Referring then to FIGS. 8A and 8B, the regulator 8 in FIG. 5 will be described. A D/A converter as shown in FIG. 8A or a voltage switching circuit as shown in FIG. 8B is used as the regulator 8.

As is shown in FIG. 8A, the D/A converter comprises a pMOS transistor P0 for voltage control, a resistive potential divider circuit, a voltage comparison circuit CP, a pMOS transistor P1 for switching, and a level shifter LS.

The voltage control pMOS transistor P0 has its source connected to a boosted power supply node to which a boosted voltage Vpp is applied, and its drain used as a D/A conversion output node. The resistive potential divider circuit comprises resistive elements R1, R2 and R3 connected in series between the drain and grounded node of the pMOS transistor P0.

The non-inverted input terminal (+) of the voltage comparison circuit CP is connected to a connection node between the resistive elements R2 and R3 of the resistive potential divider circuit. The inverted input terminal (−) of the circuit CP receives a reference voltage Vref. The output terminal of the voltage comparison circuit CP is connected to the gate of the PMOS transistor P0.

The switching pMOS transistor P1 is interposed between the drain (D/A conversion output node) of the pMOS transistor P0 and the connection node of the resistive elements R1 and R2.

The level shifter LS shifts the level of the control signal VGH and applies the level-shifted signal to the gate of the switching PMOS transistor P1. When the control signal VGH is at the H" level, the level shifter LS turns off the switching pMOS transistor P1.

When in the D/A converter shown in FIG. 8A, the control signal VGH is at the "L" level, the switching pMOS transistor P1 is in the ON state, and the opposite ends of the resistive element R1 is short-circuited. At this time, a voltage (feedback voltage) Vf applied to a series connection node between the resistive elements R2 and R3 is higher than the reference voltage Vref. Accordingly, the output voltage of the voltage comparison circuit CP is high, and the ON-resistance of the pMOS transistor P0 is also high. As a result, the voltage Vg at the D/A conversion output node is V0.

On the other hand, the control signal VGH is at the "H" level, the switching pMOS transistor P1 is in the OFF state, and the opposite ends of the resistive element R1 is not short-circuited. At this time, the feedback voltage Vf applied to the resistive potential divider circuit is low. Accordingly, the output voltage of the voltage comparison circuit CP is low, and the ON-resistance of the pMOS transistor P0 is also low. As a result, the voltage Vg at the D/A conversion output node is V1.

As aforementioned, a voltage switching circuit of a simple structure as shown in FIG. 8B may be used as the regulator 8 in FIG. 5.

In this voltage switching circuit, the pMOS transistor P0 is connected between a first input node to which a voltage V0 is applied, and an output node to which the gate voltage Vg is applied. Further, the pMOS transistor P1 is connected between a second input node to which a voltage V1 is applied, and the output node. The control signal VGH is input to the gate of the pMOS transistor P0, while a signal obtained by inverting the control signal VGH by an inverter circuit IV is input to the gate of pMOS transistor P1.

When in the voltage switching circuit, the control signal VGH is at the "L" level, the pMOS transistor P0 is in the ON state, and the voltage V0 is output as the gate voltage Vg from the output node. On the other hand, the control signal VGH is at the "H" level, the PMOS transistor P1 is in the ON state, and the voltage V1 is output as the gate voltage Vg from the output node.

The operation of the flash memory shown in FIG. 5 will now be described.

The data reading operation is performed by comparing a reading potential from a selected memory cell with a reading potential from a reference cell in the reference cell array 6, using the sense amplifier 5. The each-bit verification and weak programming operations are executed in accordance with, for example, the flowchart of FIG. 9.

First, the outline of the FIG. 9 flowchart will be described. The weak programming controller 11 in the write state machine 10 divides the addresses of memory cells to be subjected to weak programming, into the first and second groups in units of one block, thereby setting each address in the first group as an address for sample writing. The controller 11 further fixes data for verification at "0", and also fixes the gate voltage Vg at the over erase verify level OEV. The controller 11 counts the number of weak programming operations performed during sample writing for the first group addresses.

In accordance with the number of the weak programming operations performed during sample writing, the controller 11 outputs the control signal VGH, thereby setting the gate voltage Vg to be used during main writing of weak programming for addresses included in the second group. After that, the controller 11 executes main writing for the addresses of the second group, using the set gate voltage Vg.

Referring then to the flowchart of FIG. 9, a detailed description will be given of the sequence of each-bit verification and weak programming, which is assumed when a sampling method using the above-described sample writing is employed.

Figure 1A:
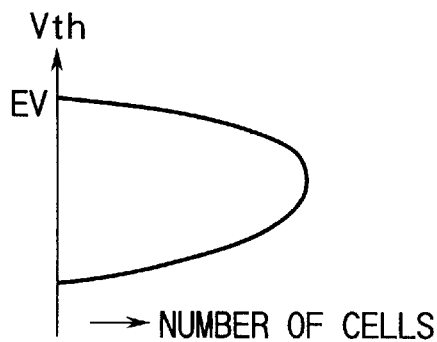
FIG. 1A is a graph showing a distribution of cell threshold values after an erasion operation is executed in a memory cell array of a flash memory.
Figure 1B:
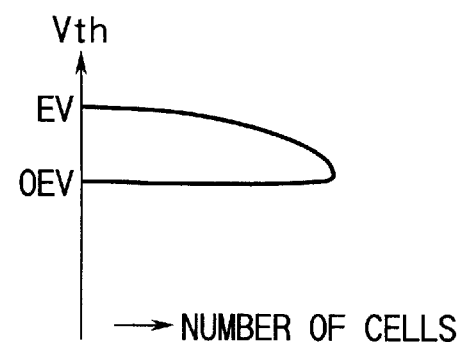
FIG. 1B is a graph showing a distribution of the cell threshold values after weak programming is executed in the memory cell array.
Figure 2:
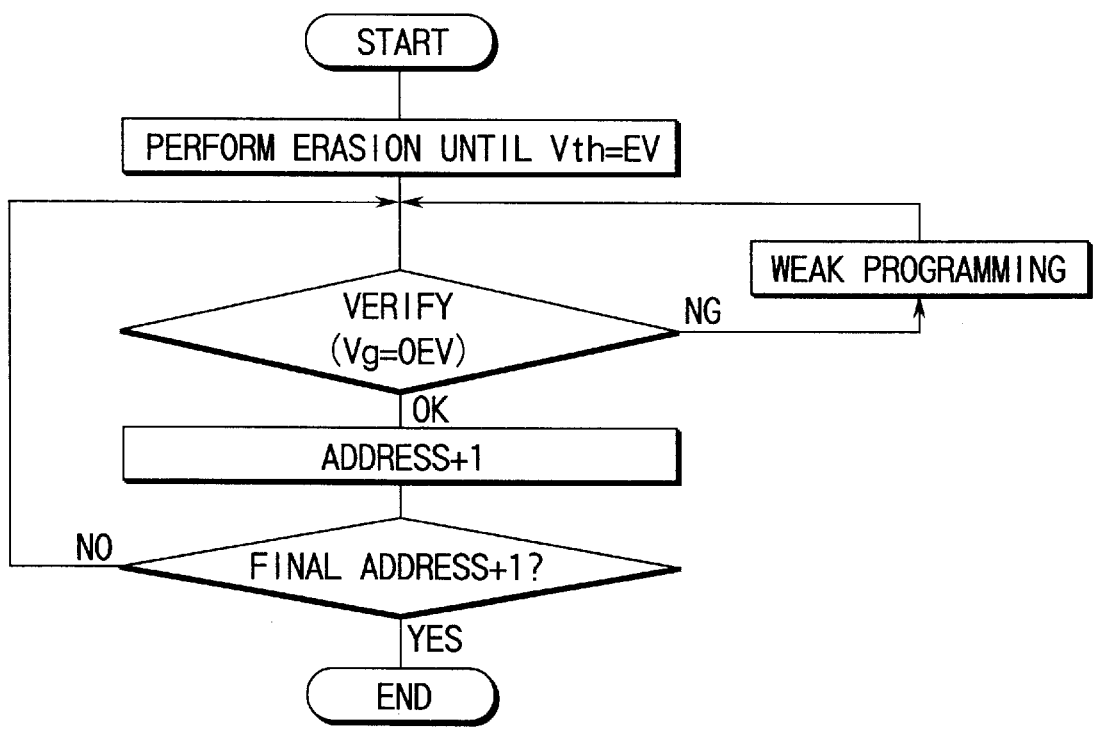
FIG. 2 is a flowchart useful in explaining the conventional operations of each-bit verification and weak programming.
Figure 3:
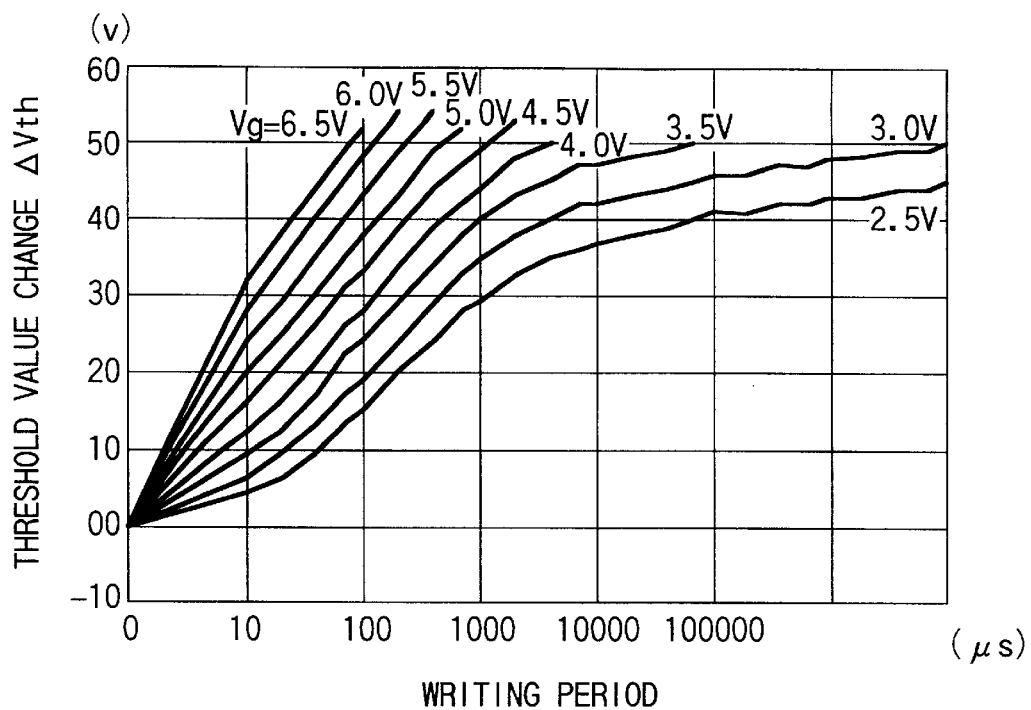
FIG. 3 is a graph illustrating the relationship between a hot electron writing period in a flash memory and a change in a cell threshold value.
Figure 9:
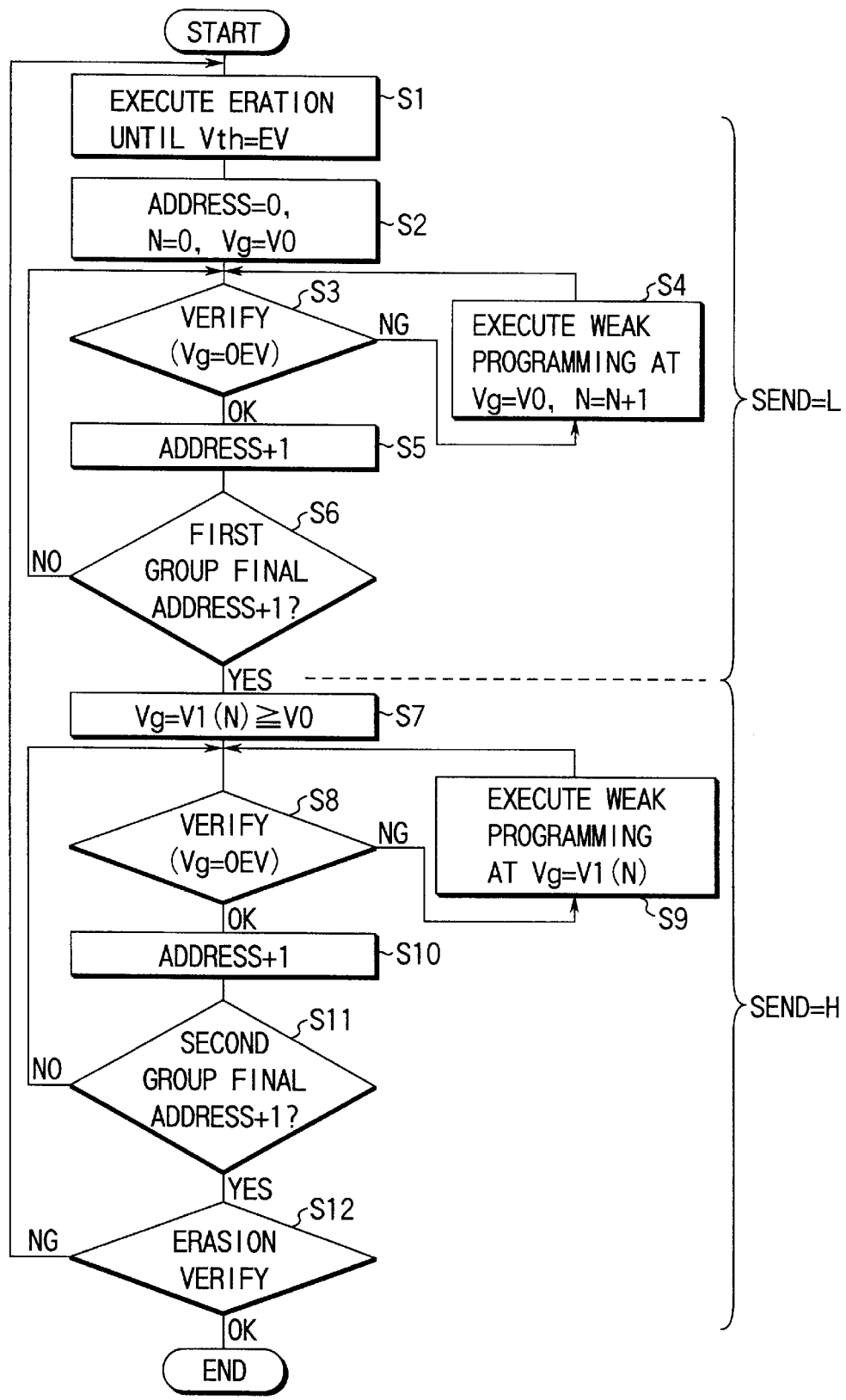
FIG. 9 is a flowchart useful in explaining each-bit verification and weak programming performed in the flash memory of FIG. 5.

The basic operation sequence does not differ between the FIG. 9 flowchart and the conventional flowchart of FIG. 2. However, they differ in that in the former, weak programming is executed using Vg=V0 if the signal SEND="L" (during sample writing), and using Vg=V1 if the signal SEND="H" (during main writing).

First, data in each cell is erased (step S1). This processing is performed until the upper limit of the distribution of the threshold values of the cells becomes the erase verify level EV.

Subsequently, the address is set at "0", and the number of weak programming operations is set at "0". Further, the gate voltage Vg is set at V0 so that the threshold value Vth will not exceed the erase verify level EV, irrespective of the initial threshold value of each cell, after weak programming is executed once at a low temperature at which the writing speed is high (step S2).

If weak programming is performed for all cells on the same condition as above, a very long time is required until all the weak programming steps finish, at a high temperature at which the writing speed is slow. For example, there is a case where a cell with a certain address, which will pass the verify test at a low temperature after executing weak programming several times, will not pass it at a high temperature unless the weak programming is repeated several tens of times.

Since the sequence of operations include a great number of main writing operations, to prevent them from requiring a large amount of time until they finish, sample writing is executed first, and then main writing is executed, using a gate voltage set in accordance with the number of weak programming operations executed during sample writing. The procedures of the sample writing and the main writing will be described.

Verification and weak programming as the sample writing is executed as follows for each cell designated by the addresses included in the first group. First, verification is executed using a gate voltage Vg of OEV (step S3). If the verification result is not good (hereinafter referred to as "NG"), weak programming is performed at a gate voltage Vg of V0, and the number N of weak programming operations is increased by 1 (step S4). After that, verification is executed again at the gate voltage Vg of OEV. Thus, the weak programming and verification is repeated until the verification result becomes good (hereinafter referred to as "OK").

The binary counter 21 shown in FIG. 7A holds the number N of executed weak programming operations during sample writing (SEND="L"). In other words, while changing addresses from one to another (step S5), the sample writing is repeated till the final address of the first group (step S6), thereby obtaining the number N of weak programming operations during sample writing. From the number N of weak programming operations, the writing condition (temperature) during the execution of weak programming of the cells included in the first group can be estimated.

After the sample writing, the regulator 8 shown in FIG. 5 is controlled on the basis of the number N of weak programming operation to optimize and set the gate voltage Vg at V1 so that the number of weak programming operations will decrease (step S7). At this time, the signal SEND and accordingly the control signal VGH become "H", whereby the regulator 8 controls the gate voltage Vg to a higher value (V1>V0) than in the sample writing. If, on the other hand, the control signal VGH is kept at "L", the gate voltage Vg is kept at the same value (V1=V0) as in the sample writing.

Subsequently, Verification and weak programming as the main writing is executed as follows for each cell designated by the addresses included in the second group. First, verification is executed using the gate voltage Vg of OEV (step S8). If the verification result is NG, weak programming is performed at a gate voltage Vg of V1 (step S9). After that, verification is executed again at the gate voltage Vg of OEV. Thus, the weak programming and verification is repeated until the verification result becomes OK.

If the verification result is OK at the step S8, the address is changed to another (step S10). If the changed address does not exceed the final one, the program returns to the step S8, and the main writing is repeated till the final address of the second group (step S11). In the main writing, the number of weak programming operations can be reduced by executing weak programming at the gate voltage Vg=V1 for the remaining cells after the sample writing. Accordingly, dependency, upon temperature, of the time required for weak programming executed after data erasure can be reduced.

After that, to confirm whether or not the cell threshold value Vth exceeds the erase verify level EV because of the weak programming, erase verification is executed at the gate voltage Vg=EV (step S12). If the verification result is NG, the program returns to the step S1, thereby repeating the above processing. On the other hand, if the verification result is OK, the each-bit verification and weak programming is finished.

To obtain an appropriate gate voltage V1 for weak programming, using the above-described sample writing method, it is necessary to estimate in advance the numbers of weak programming operations during sample writing on various conditions. Specifically, the appropriate value can be obtained from the weak programming characteristics of memory cells during sample writing on each condition (the relationship between weak programming periods and changes in threshold value), and also from the distribution function for a threshold value distribution before the reduction of the threshold value range. The outline of this estimation will be described.

Figures 10, 11:
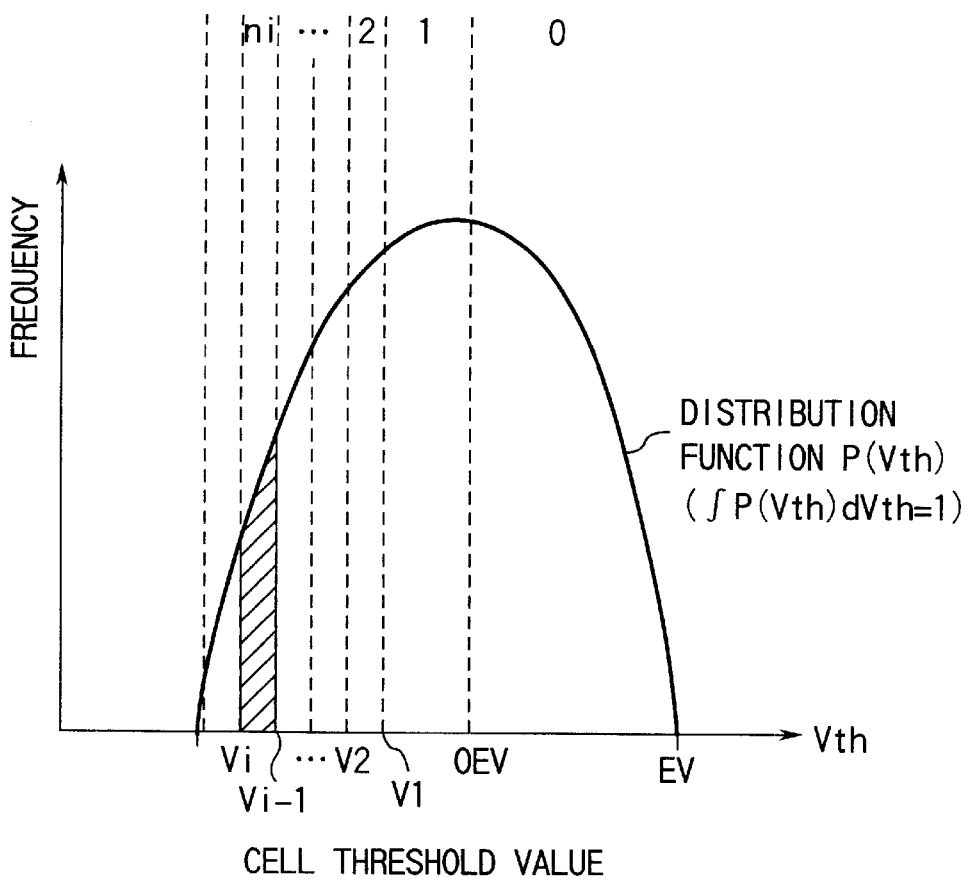
FIG. 10 is a graph showing a distribution of cell threshold values after erasion.
FIG. 11 is a table showing examples of verification results obtained when three memory cells are simultaneously selected.

To facilitate the explanation, only the temperature characteristic included in the weak programming characteristics is considered. Under a certain temperature, the weak programming period depends upon only the initial threshold value. In light of this, the threshold value distribution obtained after data erasure can be divided in accordance with the necessary number of weak programming operations, as is shown in FIG. 10. In FIG. 10, $1-n_i$ indicates the number of weak programming operations necessary for the cell threshold value Vth to become higher than OEV. Supposing that $P(V_i \leq Vth < V_{i-1})$ is a probability (distribution function) at which the threshold value Vth becomes $V_i \leq Vth < V_{i-1}$, an expected value n concerning the number of weak programming operations necessary for one cell can be calculated. When a number $n_i$ of weak programming operations is necessary for a cell having a threshold value Vth ($V_i \leq Vth < V_{i-1}$), n is given by the following expression:

$$n = \sum_{i=1}^{\infty} n_i P(V_i \leq V_{th} < V_{i-1})$$

This equation indicates that the larger the number of cells for which weak programming is executed, the closer to n the average number of weak programming operations necessary for each cell.

However, in the actual processing, cell selection is performed in units of one address, but not in units of one cell. Specifically, one word (16 cells) is selected by selecting one address, and writing is executed simultaneously. These 16 cells have different initial threshold values and require different numbers of weak programming operations. FIG. 11 shows verification results obtained when three cells are simultaneously selected by one address.

A cell 1 has a threshold value falling within a target distribution range, and hence the result of verification executed before weak programming was OK. In the case of a cell 2, the verification result became OK after the first weak programming. In the case of a cell 3, however, the result finally became OK after the third weak programming. Thus, weak programming concerning the address finishes after three weak programming operations.

As described above, the number of weak programming operations is greatly influenced by the number of weak programming operations necessary for that one of the 16 cells, which has a lowest threshold value and requires a greatest writing time period. In light of this, the probability at which writing is completed in at least one of the 16 cells after a number $n_i$ of weak programming operations is given by $$P(V_{th} \geq V_i)^{16} - P(V_{th} \geq V_{i-1})^{16}$$

Therefore, the expected value n concerning the number of weak programming operations necessary for one cell is expressed by $$n = \sum_i n_i \{P(V_{th} \geq V_i)^{16} - P(V_{th} \geq V_{i-1})^{16}\}$$

In necessary, the gate length of each cell transistor or a writing bias applied thereto may be considered.

Although in the FIG. 9 flowchart, the gate voltage Vg of a cell is controlled on the basis of the number of weak programming operations executed during sample writing, the drain voltage Vd or the weak programming period of the cell may be controlled instead of the gate voltage Vg.

Moreover, it is more desirable to have a smaller number of cells (a smaller number of addresses) to be subjected to the sample writing. However, a certain number of cells are necessary since the initial threshold value Vth of a certain cell is not known.

Figure 12:
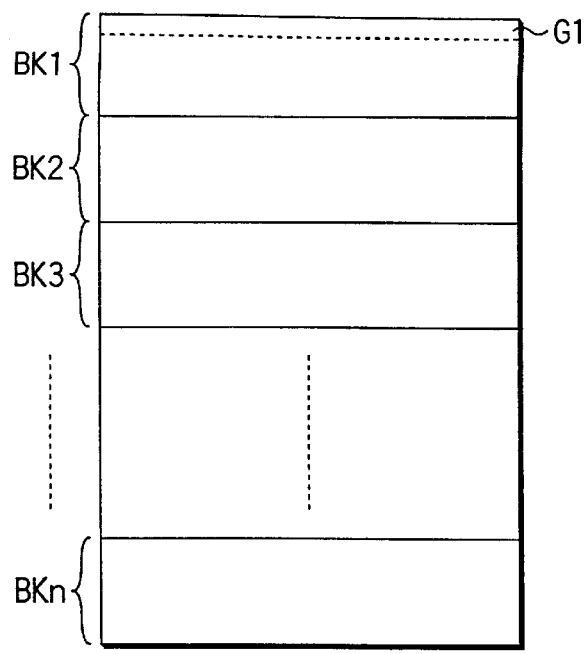
FIG. 12 is a conceptual view showing the state of a first group in another address space employed in the NOR-type flash memory.

In addition, in the first embodiment, a target cell group (first group) G1 to be subjected to the sample writing is set for each of the blocks BK1–BKn, in which data erasion can be executed simultaneously, as is shown in FIG. 6. Where the range of variations in threshold value is small and the cell characteristics do not significantly differ between blocks, a target cell is not set for each block. Instead, as shown in FIG. 12, main writing may be executed for remaining memory cells of the flash memory on the basis of the number of weak programming operations obtained from a target cell group G1 set in one block.

In the first embodiment, during main writing, the gate voltage Vg is set at a constant voltage higher than the gate voltage applied during sample writing, when the number of weak programming operations has reached a predetermined value during sample writing. However, it is possible that the gate voltage Vg applied during main writing is set variable in accordance with the number of weak programming operations during sample writing. An example of this case will be described as a second embodiment.

[Second Embodiment]

Figure 13:
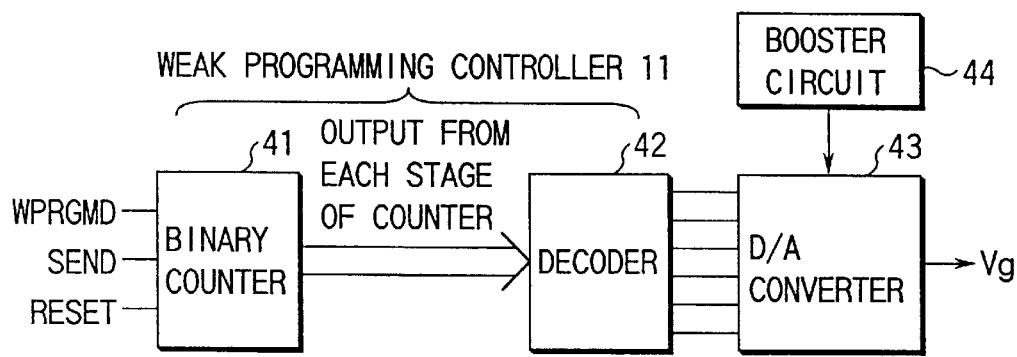
FIG. 13 is a block diagram illustrating the structures of a weak programming controller and a regulator employed in a second embodiment of the invention.

FIG. 13 is a block diagram illustrating the structures of a weak programming controller and a regulator employed in the second embodiment. The weak programming controller and regulator vary the gate voltage Vg applied to each cell during main writing, on the basis of the number of weak programming operations during sample writing.

In FIG. 13, a binary counter 41 and a decoder 42 are provided corresponding to the weak programming controller 11 of FIG. 5. Further, a D/A converter 43 is provided corresponding to the regulator 8 of FIG. 5.

The binary counter 41 has the same structure as the binary counter 21 shown in FIG. 7A, and is disposed to receive a weak programming signal WPRGMD, a sample end signal SEND and a reset signal RESET.

The decoder 42 decodes signals output from divider circuits BC1–BC3 of the binary counter 41. The D/A converter 43 receives a voltage from a booster circuit 44, and changes the voltage Vg in accordance with the output of the decoder 42.

The weak programming signal WPRGMD is set at the level "H" while weak programming is executed. Further, the sample end signal SEND is set at the "L" level during sample writing, and at the "H" level during main writing. The reset signal RESET is set at the "H" level when resetting the counter for counting the number of weak programming operations.

Figure 14:
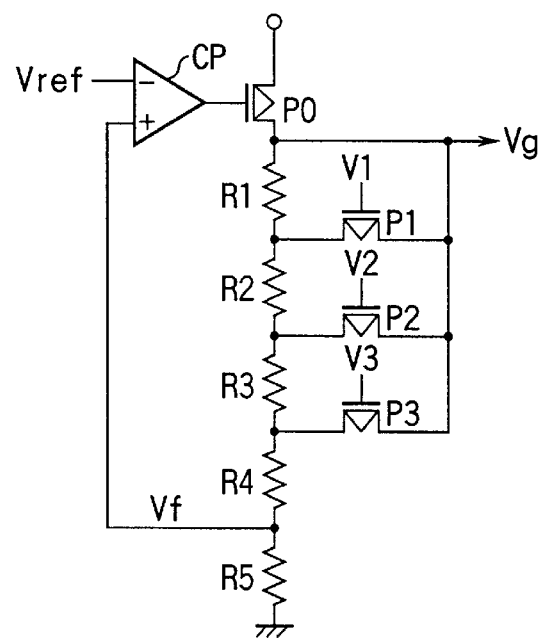
FIG. 14 is a circuit diagram showing the structure of a D/A converter appearing in FIG. 13.

Referring then to FIG. 14, the D/A converter 43 will be described in detail.

FIG. 14 is a circuit diagram showing the structure of the D/A converter 43 appearing in FIG. 13.

Figure 4:
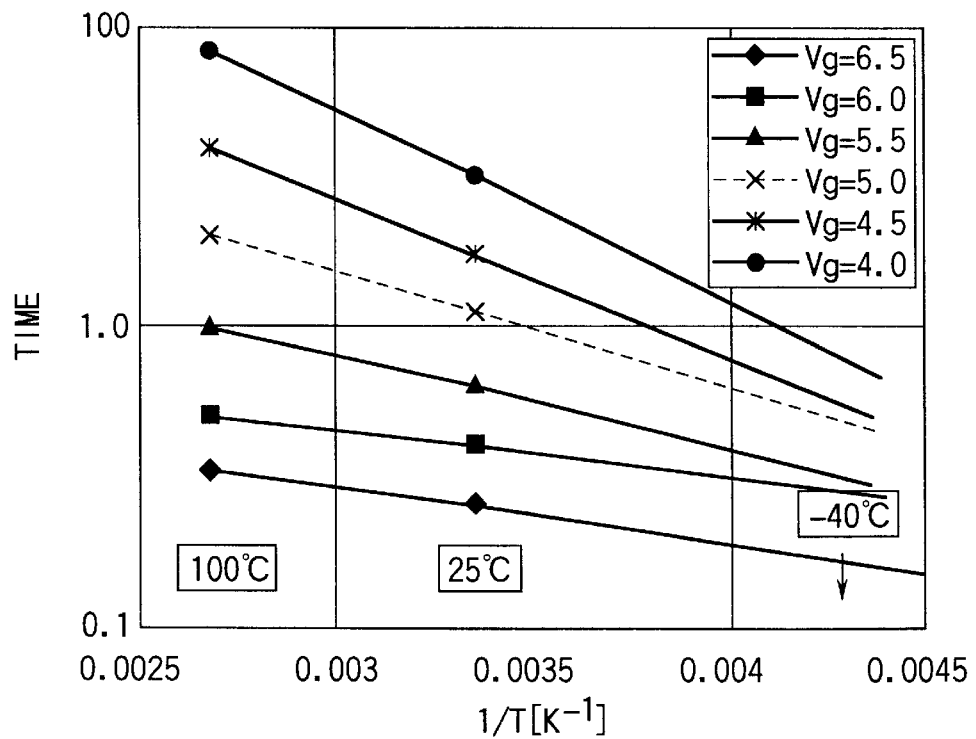
FIG. 4 is a view showing the dependency, upon temperature, of the writing time required for shifting the cell threshold value by 2V in a linear area of writing characteristics shown in FIG. 3.

The D/A converter 43 differs from the D/A converter shown in FIG. 8A as follows. The number of resistive elements R1–R5 incorporated in the resistive potential divider circuit is greater than that of corresponding elements of the FIG. 8A converter. Accordingly, the number of resistance short-circuiting nodes is greater than the latter. Switching PMOS transistors P1–P3 are connected between the D/A conversion output node and the respective resistance short-circuiting nodes, and decoder output signals V1–V3 are supplied from the decoder 42 to the switching pMOS transistors P1–P3, respectively. The decoder output signals switches the PMOS transistors P1–P3 to thereby control the output of the D/A converter 43. Further, in FIG. 14, elements similar to those in FIG. 4 are denoted by corresponding reference numerals.

When in the D/A converter of FIG. 14, the decoder output signals V1–V3 are set at an inactive level "H", the switching pMOS transistors P1–P3 are in the OFF state.

At this time, the output voltage of the voltage comparison circuit CP is controlled so that a feedback voltage Vf applied to a series connection node between the resistive elements R4 and R5 of the resistive potential divider circuit will be equal to a reference voltage Vref. As a result, the voltage Vg output from the D/A conversion output node assumes a value $Vg0=Vref\times(R1+R2+R3+R4+R5)/R5$ determined from the ratio of the resistance R5 to the series resistance of R1–R5.

When only one V1 of the decoder output signals V1–V3 has become the "L" level, only one P1 of the switching pMOS transistors P1–P3 becomes the ON state. As a result, the opposite ends of the resistive element R1 is short-circuited. Accordingly, the voltage Vg of the D/A conversion output node assumes a value $Vg1=Vref\times(R2+R3+R4+R5)/R5$ determined from the ratio of the resistance R5 to the series resistance of R2–R5. The value Vg1 is lower than the Vg0 by $Vref\times R1/R5$ resulting from the short-circuiting of R1.

On the other hand, when only one V2 of the decoder output signals V1–V3 has become the "L" level, only one P2 of the switching pMOS transistors P1–P3 becomes the ON state. As a result, the resistive elements R1 and R2 between the D/A conversion output node and the resistive element R3 are short-circuited.

Accordingly, the voltage Vg of the D/A conversion output node assumes a value $Vg2=Vref\times(R3+R4+R5)/R5$ determined from the ratio of the resistance R5 to the series resistance of R3–R5. The value Vg2 is lower than the Vg1 by $Vref\times R2/R5$ resulting from the short-circuiting of R2.

Further, when only one V3 of the decoder output signals V1–V3 has become the "L" level, only one P3 of the switching pMOS transistors P1–P3 becomes the ON state.

As a result, the opposite ends of the resistive elements R1–R3 between the series connection node of the resistive elements R3 and R4 and the D/A conversion output node are short-circuited.

Accordingly, the voltage Vg of the D/A conversion output node assumes a value $Vg3=Vref\times(R4+R5)/R5$ determined from the ratio of the resistance R5 to the series resistance of R4 and R5. The value Vg3 is lower than the Vg2 by $Vref\times R3/R5$ resulting from the short-circuiting of R3.

The operations of the weak programming controller and the regulator shown in FIG. 13 will be described.

The number of weak programming operations is counted by operating the binary counter 41 using the signal WPRGMD as a clock signal. Since the signal SEND is at the "H" level after the sample writing, the input clock signal of the binary counter 41 is kept at the "L" level. Accordingly, until the binary counter 41 is reset, it holds the number of weak programming operations during sample writing.

As described above, the decoder 42 receives and decodes the signal output from each of the divider circuits BC1–BC3 of the binary counter 41. The output voltage (the gate voltage Vg) of the D/A converter 43 is changed in accordance with the output of the decoder 42. Thus, the gate voltage Vg is selected from a plurality of voltages.

[Third Embodiment]

Where as in the second embodiment, the gate voltage Vg applied to each cell during main writing is varied on the basis of the number of weak programming operations executed during sample writing, it is important how to relate the gate voltage applied during main writing, to the number of weak programming operations executed during sample writing. In the third embodiment, the average number of weak programming operations executed for each of addresses during sample writing is calculated by representing the number of the addresses by a value that is expressed as 2 to the power of n, thereby simply setting the gate voltage used during main writing.

Figure 15:
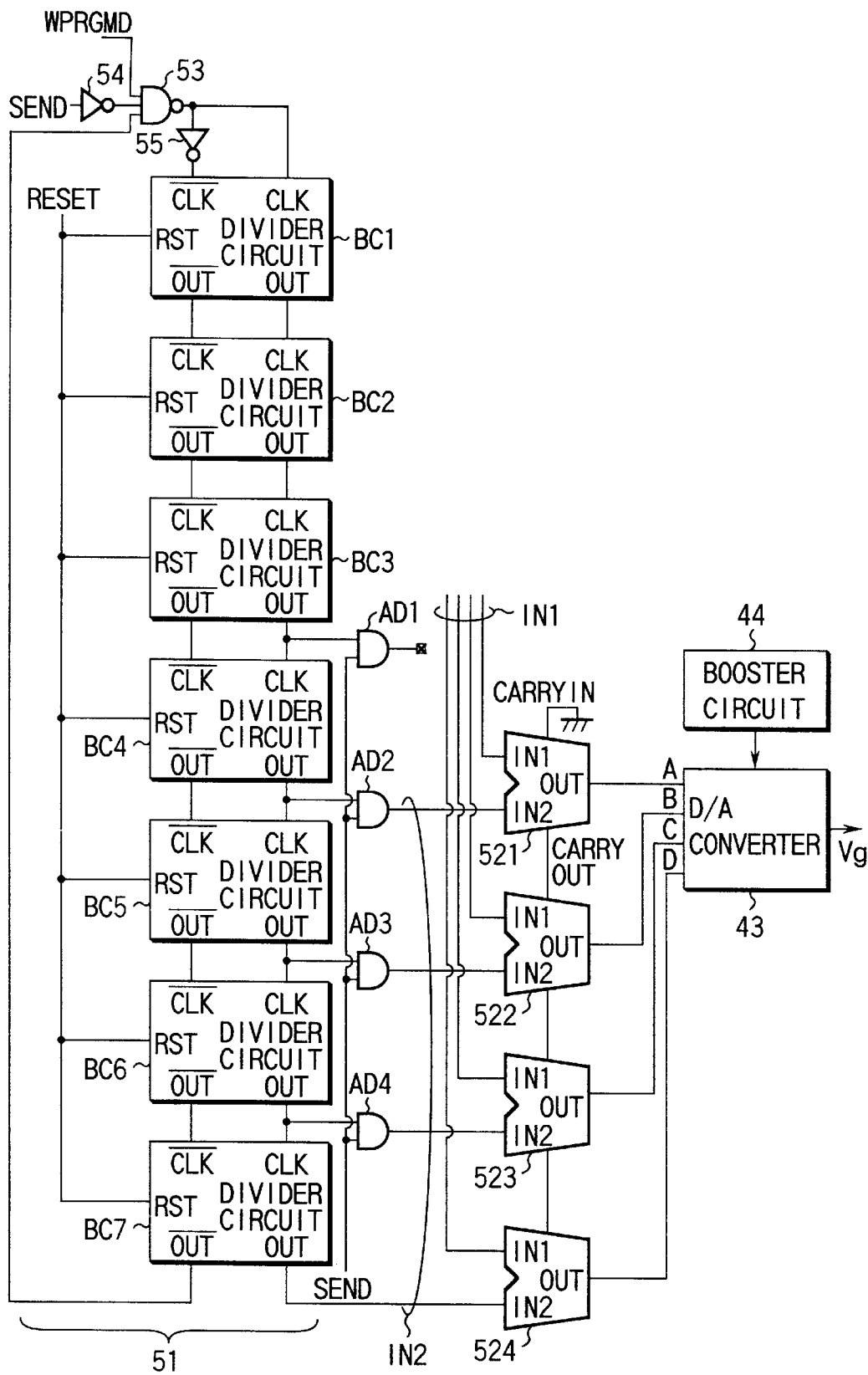
FIG. 15 is a block diagram illustrating the structures of a weak programming controller and a regulator employed in a third embodiment of the invention.

FIG. 15 is a block diagram showing the structures of a weak programming controller and a regulator employed in the third embodiment. The weak programming controller and regulator vary the gate voltage Vg applied to each cell during main writing, on the basis of the number of weak programming operations executed during sample writing.

In FIG. 15, a binary counter 51 and adders 521–524 are provided corresponding to the weak programming controller 11 of FIG. 5. The binary counter 51 has divider circuits BC1–BC7. AND gates AD1–AD4 are interposed between the divider circuits BC1–BC7 and the adders 521–524.

A NAND gate 53 has a first input terminal for receiving a weak programming signal WPRGMD, a second input terminal for receiving a sample end signal SEND, and a third input terminal for receiving the output of the /OUT terminal of the divider circuit BC7. The output of the NAND gate 53 is input to the CLK terminal of the divider circuit BC1 and also to the /CLK terminal of the circuit BC1 via an inverter 55.

Further, a D/A converter 43 is provided corresponding to the regulator 8 of FIG. 5, and disposed to receive a boosted voltage from a booster circuit 44.

The binary counter 51 counts the number of occasions in which the weak programming signal WPRGMD is at the "H" level during sample writing, i.e. while the sample end signal SEND is at the "L" level.

The gate voltage (D/A conversion output voltage) Vg applied to each cell during weak programming is determined from two input values A–D to the D/A converter 43. For example, the relationship between the D/A converter input and output values is set as shown in FIG. 6. Each input value A–D is the sum of input signals IN1 and IN2 created by a corresponding one of the adders 521–524.

The input signal IN1 is a digital signal that indicates a minimum gate voltage used during weak programming, i.e. a gate voltage used during sample writing. Specifically, referring to FIG. 16, the input signal IN1 assume a value of (0, 0, 0, 0) where the gate voltage during sample writing is set at 2.0V, and a value of (0, 0, 0, 1) where the gate voltage is set at 2.5V. The input signal IN2 indicates the number of weak programming operations, and represents an increase in gate voltage during main writing. The adders each comprise a circuit including pass transistors PH1–PH4, inverters IV1–IV6, and a circuit including NAND gates ND5–ND8, as is shown in FIGS. 17A and 17B.

In the circuit constructed as above, the number of addresses used for sample writing is set at a value that can be expressed as 2 to the power of n. In this case, the average number of weak programming operations executed for each address is identical to a value obtained by excluding lower n-bit outputs (i.e. the outputs of the divider circuits BC1–BCn) from the output of the binary counter 51 (BC1–BC7), which indicates the number of weak programming operations.

For example, where the number of addresses to be subjected to sample writing is set at 8 ($=2^3$), the average number of weak programming operations executed for each address is identical to a value obtained by excluding the outputs of the divider circuits BC1–BC3 from the outputs of the divider circuits BC1–BC7, i.e. identical to the sum of the outputs of the divider circuits BC–BC7, as is shown in FIG. 15. In this case, the relationship between the average number of weak programming operations and the input signal IN2 is as shown in FIG. 18, and an increase $\Delta Vg$ in gate voltage can be set as shown in FIG. 18.

As described above, the number of addresses used for sample writing is expressed as $2^n$, and the upper-bit ((n+1) bits or more) outputs of the binary counter 51 is used as a signal for setting a gate voltage increase during main writing. As a result, the gate voltage increase during main writing can be very easily optimized. In the circuit of FIG. 15, AND gates AD1–AD4 are connected so as not to reflect the gate voltage increase during sample writing.

[Fourth Embodiment]

The entire structure of the flash memory can be made simplest by outputting, during sample writing, a signal SEND informing the final address when the count value of the address counter 4a of the address controller 4 in FIG. 5 has reached a predetermined value.

Figure 19A:
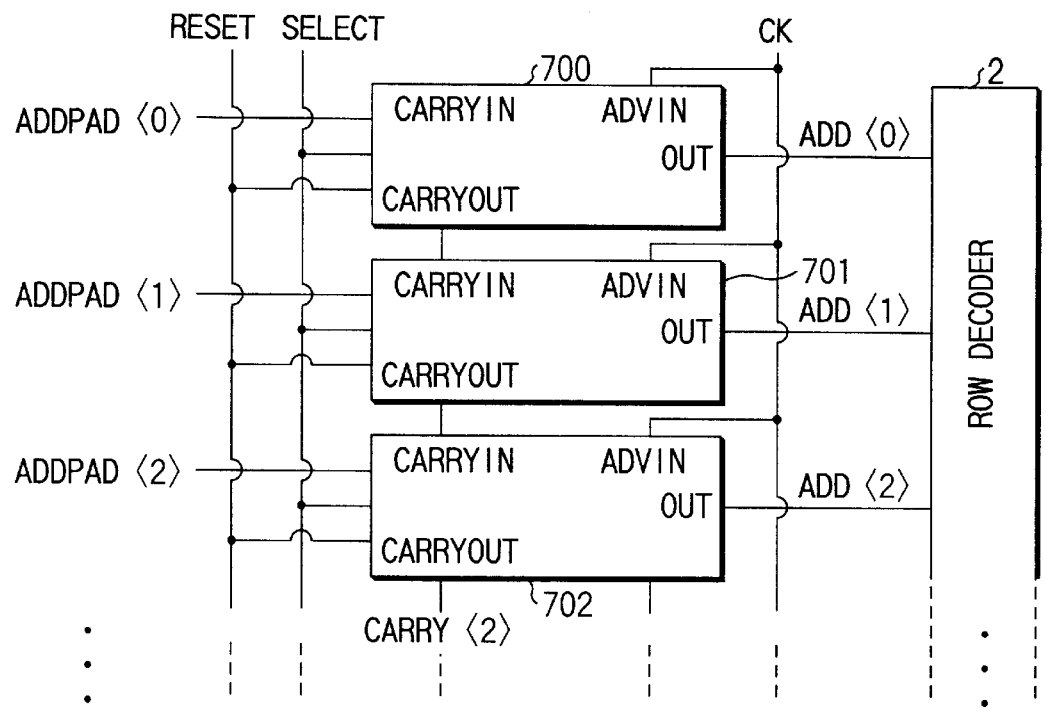
FIG. 19A is a circuit diagram showing the structure of an address controller incorporated in a fourth embodiment of the invention.

FIG. 19A is a circuit diagram showing the structure of the address controller used in the fourth embodiment. In this embodiment, a description will be given of a case where the number of word lines in a memory cell array having 1024 word lines is counted.

In FIG. 19A, 70i indicates an address counter, RESET a reset signal for resetting the count value of the address counter 70i, ADDPAD<i> (i=0–8) an address signal to be input from the outside of the chip, SELECT an address selecting signal for selecting input address signals, and ADD<i> (i=0–8) an address signal used in the chip.

In each address counter 70i, ADVIN indicates a clock input terminal through which a clock signal CK is input, CARRYIN a carry input terminal through which a carry signal CARRY is input, CARRYOUT a carry output terminal through which the carry signal is output, and ADD<i> (i=0–8) a signal indicating a count value and to be supplied to a row decoder 2. The address counters include a counter corresponding to row addresses (hereinafter referred to as a "row address counter"), and a counter corresponding to column addresses (hereinafter referred to as a "column address counter"). FIG. 19A, however, shows only the counter corresponding to the row addresses.

Figure 19B:
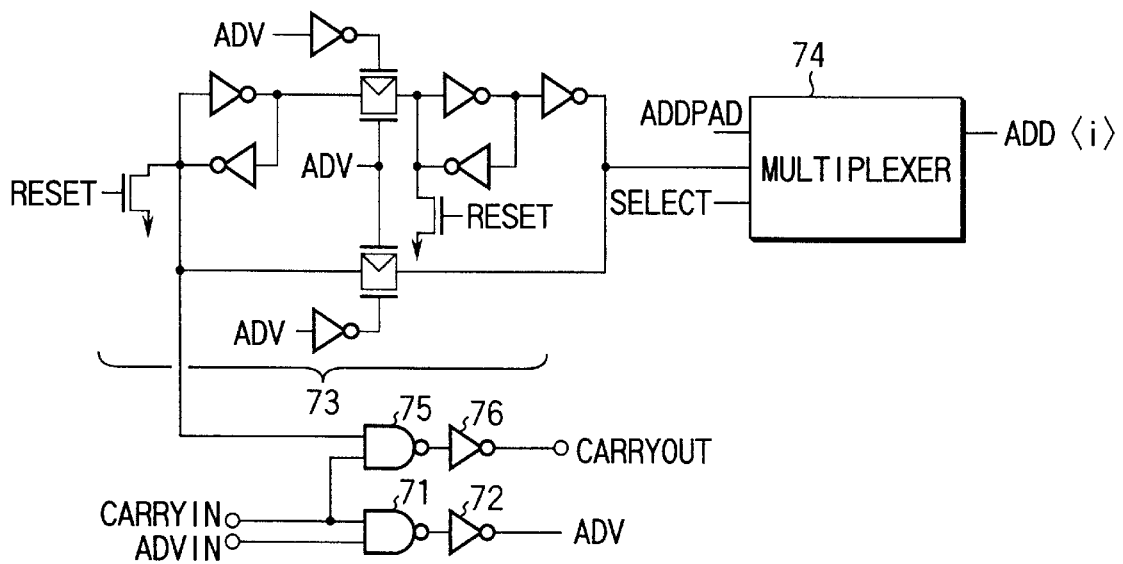
FIG. 19B is a circuit diagram showing the structure of an address counter incorporated in the address controller.

FIG. 19B is a circuit diagram showing the structure of the address counter 70i appearing in FIG. 19A.

This address counter comprises a NAND gate 71 for providing the negative AND (NAND) of the clock signal input to the clock input terminal ADVIN and a carry signal input from a previous circuit to the carry input terminal CARRYIN; an inverter 72 for inverting the output of the NAND gate 71 and outputting a signal ADV; an F/F circuit 73 which has a reset input terminal for receiving the reset signal RESET, and performs inversion in accordance with the signal ADV; a multiplexer 74 for selecting one of the output of the F/F circuit 73 and the address signal ADDPAD<i> input from the outside of the chip, thereby outputting it as the address signal ADD<i>; a NAND gate 75 for providing the negative AND of the output of the F/F circuit 73 and the carry signal input from the previous circuit to the carry input terminal CARRYIN; and an inverter 76 for inverting the output of the NAND gate 75 and outputting it as the carry signal CARRY from the carry output terminal CARRYOUT.

Figure 20:
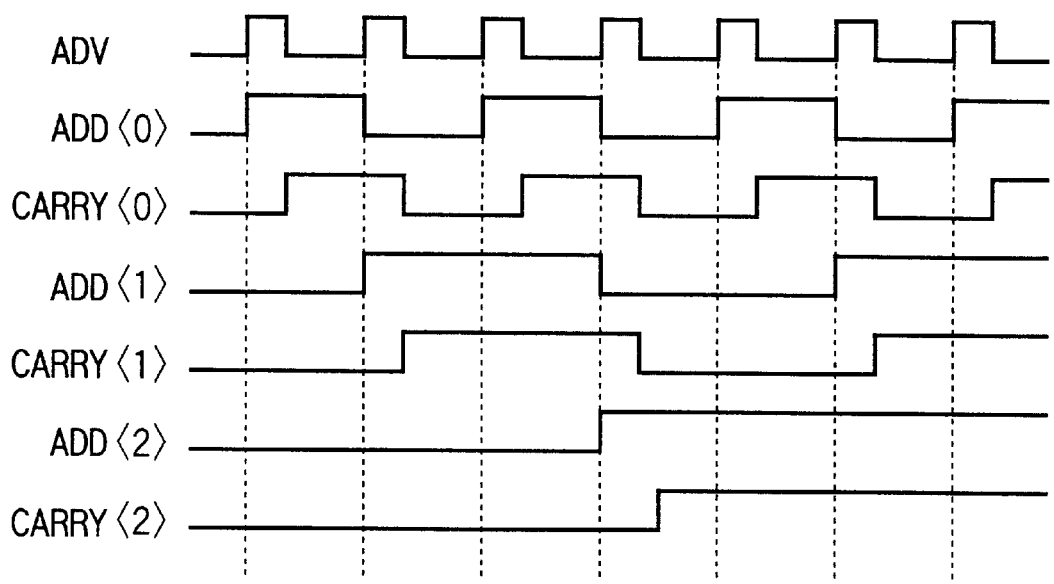
FIG. 20 is a timing chart indicating the operation of the address controller of FIG. 19A.

FIG. 20 is a timing chart useful in explaining the operation of the address controller of FIG. 19A.

The address controller of FIG. 19A counts clock signals input to the clock input terminal ADVIN after it is reset by the reset signal RESET. The address controller selects, using the address selecting signal SELECT, one of the address signal ADDPAD<0>–ADDPAD<8> input from the outside of the chip and a signal output from each address counter, thereby outputting it as the address signal ADD<0>–ADD<8>.

Figure 21:
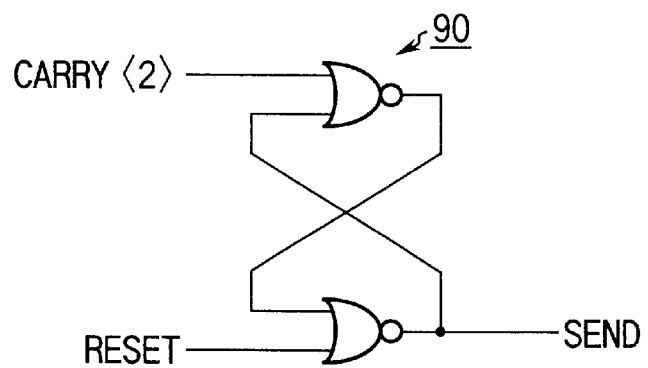
FIG. 21 is a circuit diagram showing a SEND signal generating circuit incorporated in the address controller of FIG. 19B.

FIG. 21 is a circuit diagram showing the structure of a circuit, according to a fourth embodiment, incorporated in the address controller for generating a SEND signal.

The circuit of FIG. 21 can generate the SEND signal, using a simple structure as shown in which the reset signal RESET and the carry signal CARRY are input to the reset input terminal and the set input terminal of an F/F circuit 77, respectively. If, for example, a carry signal CARRY<2> output from the third stage of the row address counter is used as the carry signal CARRY, cells of four word lines are used as samples until the carry signal CARRY<2> becomes "1".

A description will now be given of a case where a circuit for generating the SEND signal is provided in a flash memory in which data erasion can be executed in units of one block.

In some NOR-type flash memories, a memory cell array is divided into a plurality of memory cell blocks, and an erasion control section is provided for the execution of erasion in units of one block, in which data in all cells in each block is erased simultaneously.

Figure 23A:
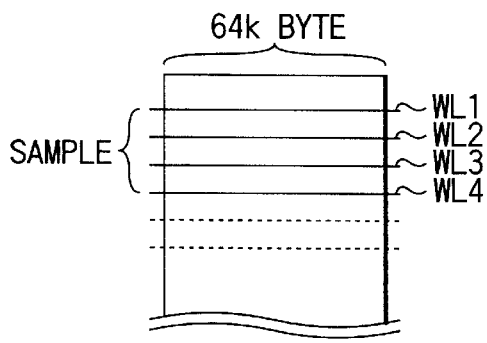
FIGS. 23A and 23B are conceptual views illustrating cell arrays used as samples when performing multi-block simultaneous erasion on regular blocks in the third embodiment of the invention.
Figure 23B:
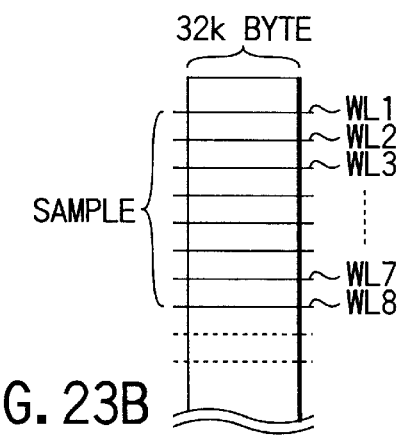

FIGS. 23A and 23B show word lines used for sample writing with simultaneously erasable blocks of 64K bytes and of 32K bytes, respectively. In the case of the 64K-byte blocks shown in FIG. 23A, sample writing is executed using word lines WL1–WL4. In the case of the 32K-byte blocks shown in FIG. 23B, sample writing is executed using word lines WL1–WL8.

There is a flash memory in which the erasion unit (i.e. block unit) is 64K bytes at a certain address, and 8K bytes at another address. In the flash memory of this type, the number of cells included in each word line differs between blocks of different erasion units. Accordingly, the number of sample cells used for sample writing may differ between sampling periods of regular blocks and irregular blocks, if the signal SEND is generated by supplying the SEND signal generating circuit of a simple structure as shown in FIG. 21 with the carry output signal of the row address counter.

Figure 22:
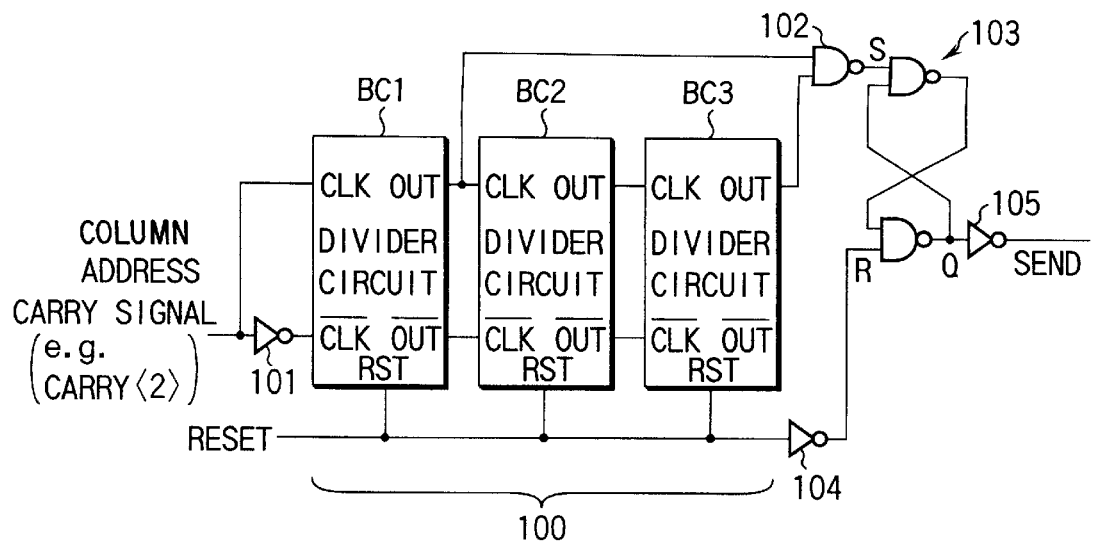
FIG. 22 is a circuit diagram showing a SEND signal generating circuit corresponding to multi-block-simultaneous-erasion in the address controller of FIG. 19B.

To solve this problem, the signal SEND is generated using a SEND signal generating circuit as shown in FIG. 22. Specifically, the signal is generated by processing, using a binary counter 100, the carry output signal of the column address counter, instead of the carry output signal of the row address counter.

In the SEND signal generating circuit of FIG. 22, the binary counter 100 includes divider circuits BC1–BC3 like the weak programming controller of the first embodiment shown in FIG. 7A.

The clock input terminal /CLK of the first-stage divider circuit BC1 receives a carry output signal (e.g. CARRY<2>) output from the column address counter. The terminal /CLK also receives a signal obtained by inverting the carry output signal by an inverter 101.

The negative AND (NAND) of the first-stage divider circuit BC1 and the final-stage divider circuit BC3 is obtained by a NAND gate 102. The output of the NAND gate 102 is input to the set input terminal S of an SR-type F/F circuit 103. The reset signal RESET is inverted by an inverter 104, and input to the reset input terminal R of the SR-type F/F circuit 103. A signal from the output terminal Q of the SR-type F/F circuit 103 is inverted by an inverter 105 and output as the signal SEND.

The number of divider circuits can be reduced if the carry output signal (e.g. CARRY<2>) of a circuit of a stage corresponding to the number of columns included in the minimum block of the irregular blocks is used as the carry output signal of the column address counter. In this case, however, all blocks must have a bit size that is an integer multiple of that of the minimum block.

Furthermore, each-bit verification and weak programming according to the invention may be executed after performing simultaneous erasion on a plurality of blocks of different erasion units (bit sizes) by the use of the erasion control section of the NOR-type flash memory.

Figure 23C:
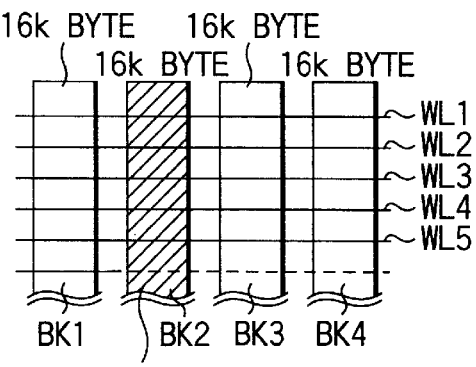
FIG. 23C is a conceptual view showing an example of a cell array used as a sample when performing multi-block simultaneous erasion on irregular blocks.

For example, even where a multi-block simultaneous erasion system is employed as shown in FIG. 23C, the SEND signal generating circuit shown in FIG. 22 is effective.

When, as shown in FIG. 23C, only part (e.g. three blocks BK1, BK3 and BK4) of blocks BK1–BK4, obtained by dividing a memory block of 64K bytes into four equal portions in a row direction, is subjected to data erasion (irregular block data erasion), the total number of cells, 16, obtained by adding 15 (=3×5) cells corresponding to five word lines WL1–WL5 to one cell corresponding to one column included in one block, are used as samples.

[Fifth Embodiment]

In the NOR-type flash memory, it is convenient if reading or writing can be executed in a block while executing erasion in another block. This is because the time required for erasion is long (about 1 second). To this end, the NOR-type flash memory has an operation mode (hereinafter referred to as an "erasion suspend mode") for executing reading or writing in a block while erasion executed in another block is temporarily stopped. The manner described in the fourth embodiment can be applied to the erasion suspend mode. A description will be given of a fifth embodiment in which the manner of the fourth embodiment is applied to the erasion suspend mode.

Where the manner of the fourth embodiment is applied to the erasion suspend mode, if the temperature greatly varies during the erasion suspension, it is possible that the gate voltage Vg optimized by sample writing before the erasion suspension will be inappropriate after the erasion suspension.

To deal with the above, it suffices if sample writing is executed again after the erasion suspension finishes. This kind of control of sample wiring can be sufficiently done, using the output signal SEND of the SEND signal generating circuit of FIG. 22.

If the erasion suspend mode is entered after sample writing finishes and an appropriate gate voltage Vg is set, sample writing is restarted after the erasion suspend mode finishes, to thereby newly set an appropriate gate voltage Vg.

Figure 24:
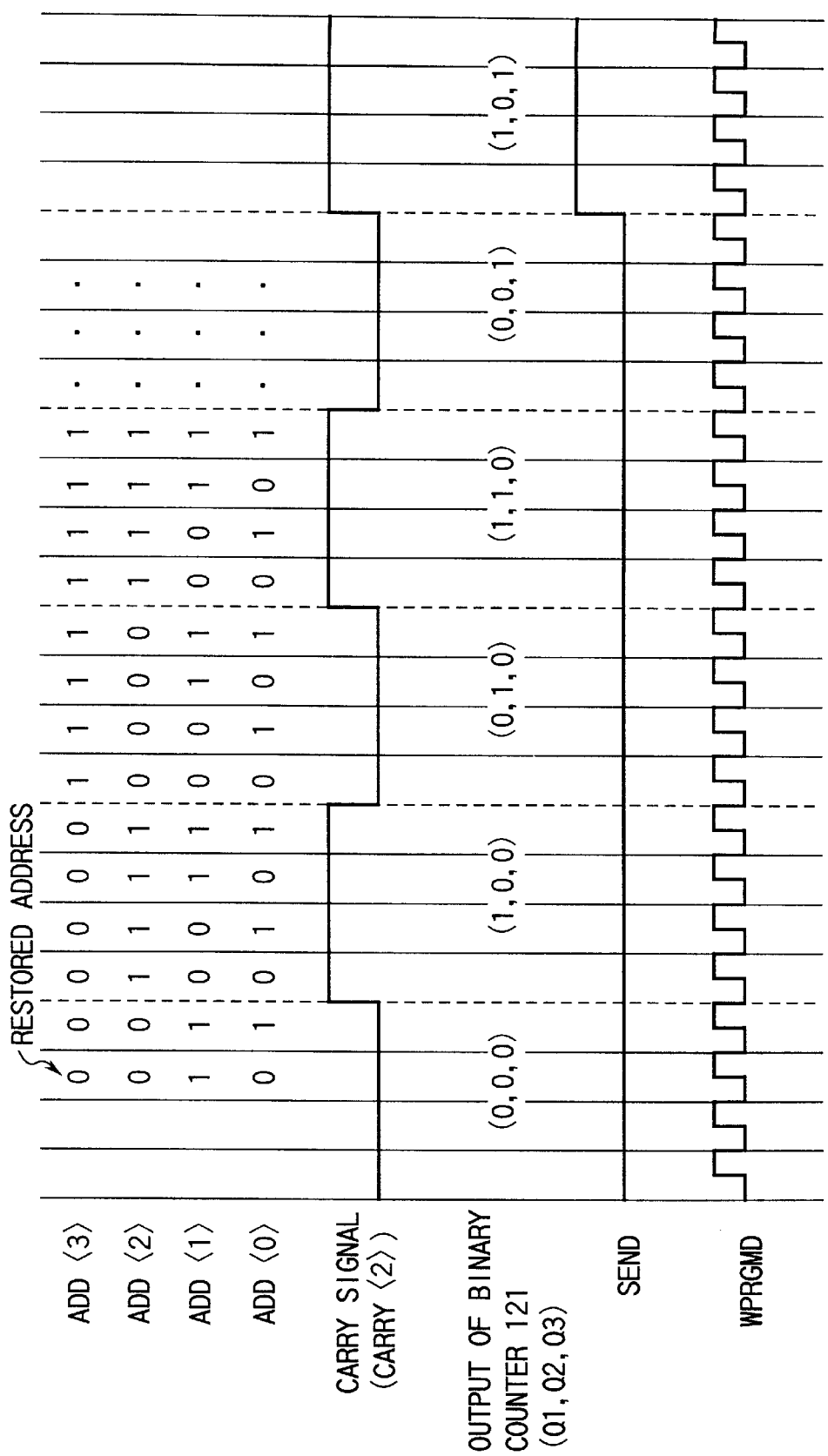
FIG. 24 is a schematic view showing an example of a relationship between each signal and each address obtained by executing sample writing after the restoration from an erasion suspend mode in a fifth embodiment of the invention.

If, however, the erasion suspend mode is entered during sample writing (i.e. during counting the number of weak programming operations), the following problem will occur. This will be described with reference to FIG. 24. FIG. 24 shows an example of a relationship between each signal and each address assumed when sample writing has been executed after the erasion suspend mode has finished.

It is possible that the erasion suspend mode will be entered during the processing of that one of addresses corresponding to one bit (one "0" or "1" period) of the carry signal, which is other than the first address. In this case, the address assumed when the mode is restored from the erasion suspend mode is that one of addresses corresponding to one bit of the carry signal, which is other than the first address. Accordingly, when sample writing has been newly started, the number of addresses corresponding to the lowest bit of the carry signal differs from that of addresses corresponding to another bit of the signal. FIG. 24 shows a case where the mode is restored at the third address included in four addresses corresponding to one bit of the carry signal. As is understood from FIG. 24, the number of addresses corresponding to the lowest bit of the carry signal is two, while the number of addresses corresponding to any other bit of the signal is four. Although FIG. 24 shows the case where the number of addresses corresponding to the lowest bit of the carry signal is two, the number of addresses depends upon the state of sample writing assumed immediately before the execution of the erasion suspend mode. In such a case, the number of addresses is not expressed as 2 to the power of n. This means that it is difficult to calculate the average number of weak programming operations for each address by the method described in the third embodiment.

This problem can be solved by excluding, from the total number of weak programming operations executed during sample writing, the number of weak programming operations executed for one of the addresses corresponding to the first input bit of the carry signal. For example, the problem can be solved by limiting to-be-counted writing pulses using a weak programming controller, as shown in FIG. 25, which can deal with the erasion suspend mode.

Figure 25:
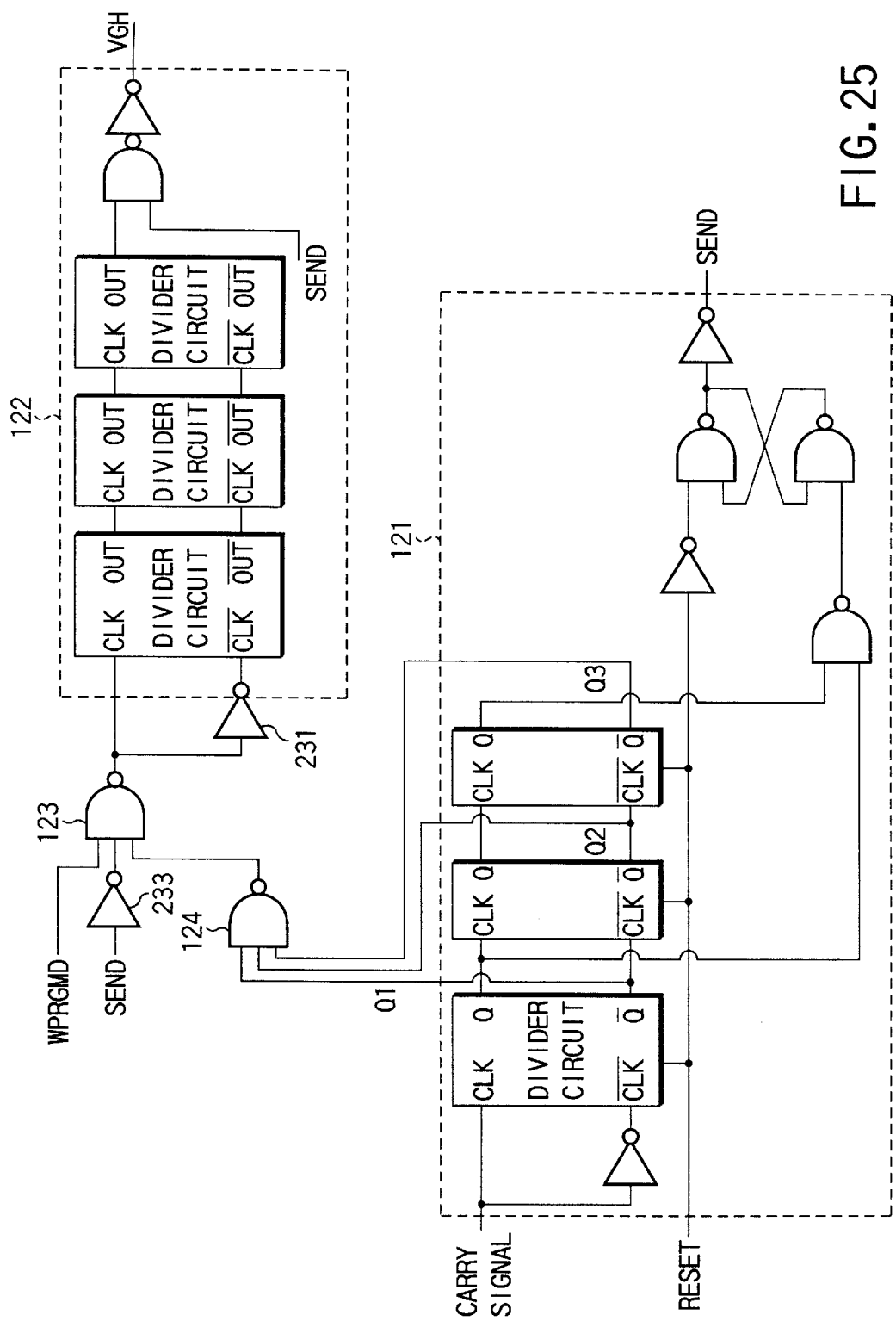
FIG. 25 is a circuit diagram showing a weak programming controller and a SEND signal generating circuit incorporated in the fifth embodiment of the invention.

In a weak programming controller 122 shown in FIG. 25, a SEND signal generating circuit 121 has the same structure as the circuit that is shown in FIG. 22 and corresponds to the multi-block simultaneous erasion system. The weak programming controller 122 differs from the controller, according to the first embodiment, shown in FIG. 7A in that in the former, a NAND gate 123 having three inputs is used in place of the NAND gage 221 having two inputs.

A NAND gate 124 provides the negative AND of outputs supplied from the output terminals /Q of the divider circuits of the SEND signal generating circuit 121. The output of the NAND gate 14 is input to the three-input NAND gate 123 together with the signals WPROGMD and SEND.

The weak programming controller 122 shown in FIG. 25 can execute control so as not to count the number of weak programming operations by fixing the output of the NAND gate 124 at "0", if the outputs from the output terminals /Q of the divider circuits are all "1", i.e. until the first-stage divider circuit generates the carry signal CARRY.

Since this structure can prevent counting of the number of sample writing operations for the lowest bit of the carry signal, the average number of weak programming operations for one address can be easily calculated even in the erasion suspend mode.

[Sixth Embodiment]

In a sixth embodiment, dummy cells dedicated to sample writing are provided. In the first to fifth embodiments, normal cells (from which data is also read) in a memory cell array are used as cells on which sample writing is executed when performing weak programming. A predetermined small number of cells included in the normal cells are subjected to sample writing, thereby detecting the writing period that significantly varies depending upon the temperature.

The reason why sample writing is executed on a plurality of cells is that there is a case where the verify test is passed after a very small number of weak programming operations if the initial threshold value Vth obtained immediately after erasion exists in the vicinity of the over erasion verify level OEV even at a slow-writing temperature. In other words, it is the object of the weak programming to make the threshold value Vth fall within a range of from the erasion verify level EV to the over erasion verify level OEV. Therefore, if, for example, calls with a low threshold value Vth that is farthest from the range of EV–OEV are selected and subjected to sample writing, the number of cells to be subjected to sample writing can be minimized.

In light of this, a desired number of rows of dummy cells (not shown) from which no data will be read actually are included in a block as an erasion unit, as well as normal cells.

To execute each-bit verify and weak programming after data erasion from blocks (e.g. simultaneous data erasion from a plurality of blocks), first, weak programming is executed on the dummy cells under the first writing condition. After that, a second wiring condition is set in which the voltage applied to each cell is varied in accordance with the time required for weak programming, thereby executing each-bit verification and weak programming under the second writing condition.

Concerning the dummy cells dedicated to sample writing, it is desirable to set their threshold value Vth for data erasion at a value lower than that of the normal cells from which data is read, by controlling the coupling ratio, the channel width W or the channel length L of the cell transistors. Specifically, to form a dummy cell of a lower threshold voltage Vth than a normal cell, for example, the coupling ratio between the control gate and the floating gate of a dummy cell is increased. The use of such a dummy cell for sample writing enables the detection of a slow-writing temperature condition using only one or several samples of dummy cells.

[Seventh Embodiment]

Method for shortening the time required for writing include a step-up writing method for gradually increasing the gate voltage Vg in units of one writing pulse.

In the step-up writing method, a cell of a certain address is selected, and writing and verification is repeated until the writing verify test is passed. Each time the verification result is NG, a gate voltage Vg obtained by adding a predetermined step-up amount $\Delta Vg$ (e.g. 0.5V) to the present gate voltage Vg is applied to the selected cell during each writing operation. As a result, the threshold voltage of the cell can be sufficiently varied in the second writing operation et seq.

In the seventh embodiment, the step-up writing is executed during each-bit verification and weak programming in the first to sixth embodiments.

Figure 26:
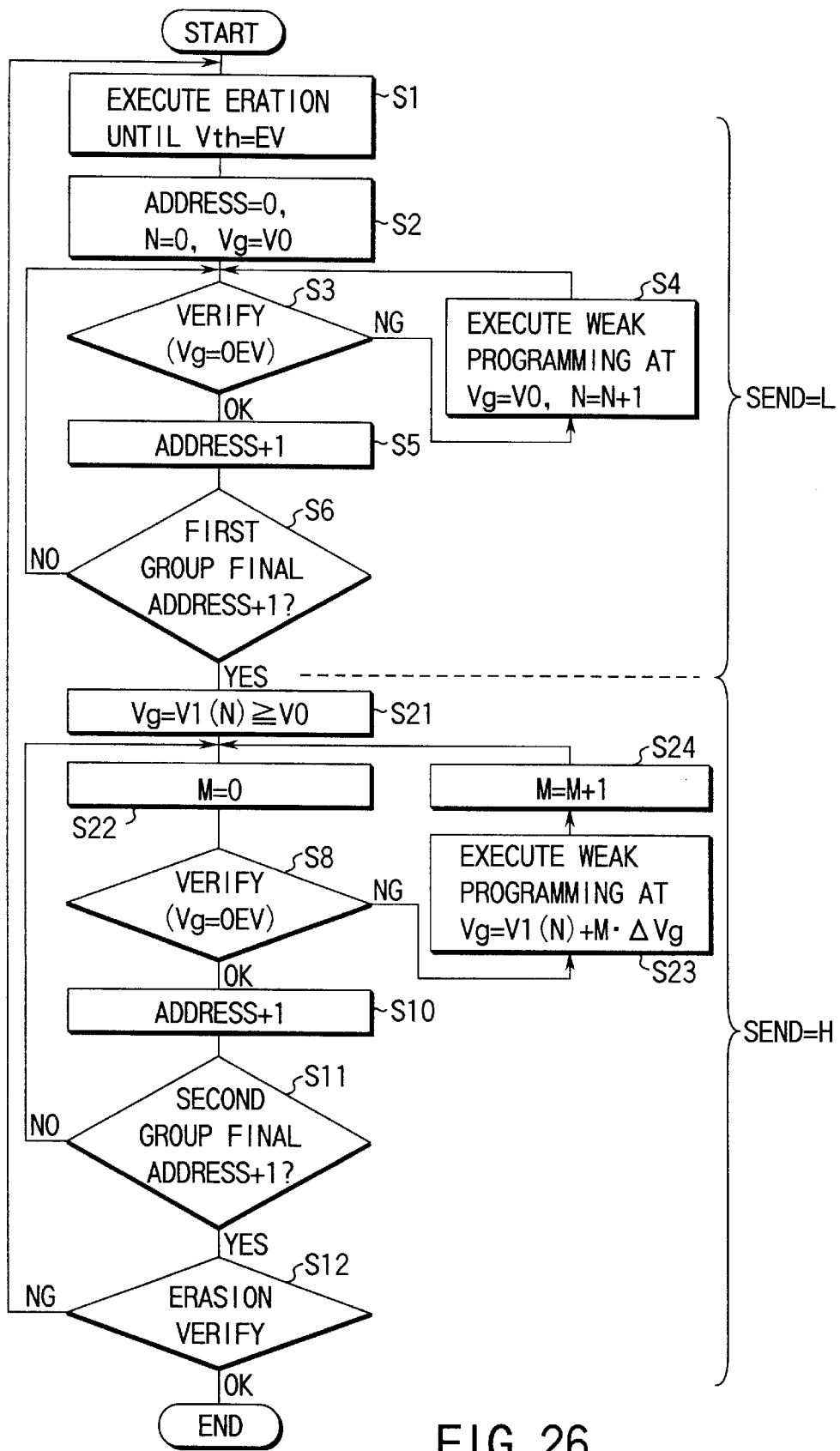
FIG. 26 is a flowchart useful in explaining each-bit verification and weak programming performed in a seventh embodiment of the invention.
Figure 27:
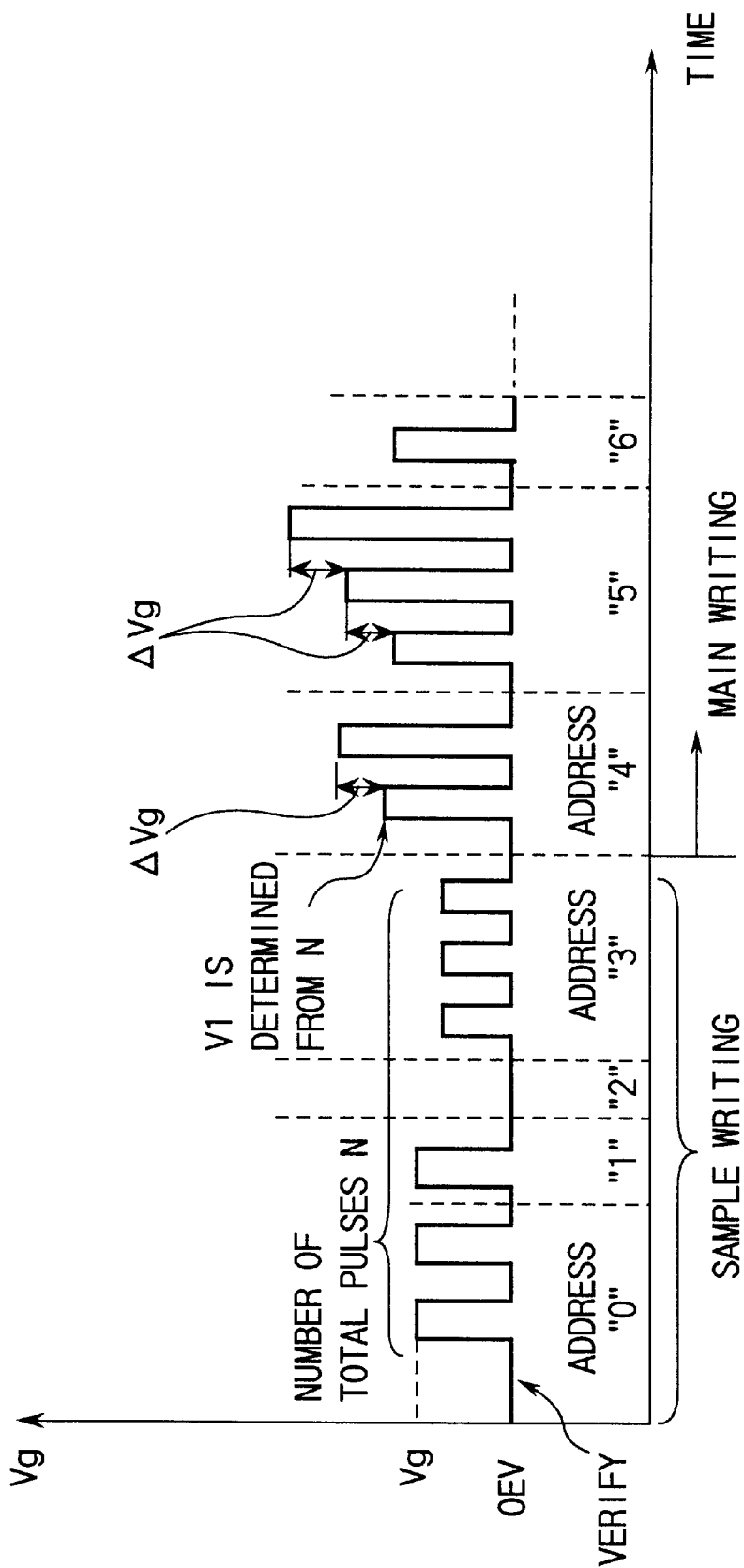
FIG. 27 is a view showing changes in gate voltage Vg in the weak programming performed in the seventh embodiment of the invention.

Referring to the flowchart of FIG. 26 and the graph of FIG. 27 showing changes in gate voltage Vg, an example of an operation according to the seventh embodiment will be described.

During sample writing, verification and weak programming is repeated in units of one bit, with the gate voltage Vg fixed (steps S1–S6), thereby counting the total number N of writing pulses (indicating the number of weak programming operations) (step S4).

After sample writing, main writing is executed as follows. First, the initial value of the gate voltage Vg assumed during a first writing operation for each address is set at V1 (N) corresponding to the total number N of the writing pulses (step S21). Further, the number M of step-up operations is set at "0" (step S22). The number M of step-up operations is increased by "1", and used to set the gate voltage Vg for weak programming.

Subsequently, verification is executed at the gate voltage Vg=OEV (step S8). If the verification result is NG, weak programming is performed at the gate voltage Vg=V1(N)+M·$\Delta Vg$ (step S23). Then, the number M of step-up operations is increased by "1" (step S24). After that, verification is performed again at the gate voltage Vg=OEV. Thus, weak programming and verification is repeated until the verification result becomes OK. In the main writing, each weak programming operation is executed while the gate voltage Vg is increased by a step-up amount of $\Delta Vg$ as shown in FIG. 27.

If the verification result is OK at the step S8, the address is changed (step S10). If the changed address does not exceed the final one, the program returns to the step S8, thereby repeating main writing till the final address of the second group (step S11). In the main writing, the number of weak programming operations can be more reduced by performing weak programming on remaining cells after the sample writing, at the gate voltage Vg=V1(N)+M·$\Delta Vg$. Accordingly, the dependency, upon temperature, of the time required for weak programming executed after data erasion can be reduced.

After that, erase verification is executed on all cells at the gate voltage Vg=EV in order to confirm whether or not the cell threshold value exceeds the erase verify level EV after weak programming (step S12). If the verify result is NG, the program returns to the erasion processing at the step S1, thereby repeating the above-described operations. On the other hand, if the verify result is OK, the sequence of each-bit verification and weak programming is finished.

As described above, in the seventh embodiment, the initial value of gate voltage Vg is changed during main writing in accordance with the total number N of writing pulses counted during sample writing. However, the step-up amount $\Delta Vg$ may be changed as well as the initial gate voltage Vg.

Further, although in the seventh embodiment, the gate voltage Vg is fixed during sample writing, the above-described step-up writing may be used as weak programming during sample writing. For example, the step-up writing is executed under both first and second initial conditions until a predetermined address is reached, and only under the second initial condition after the predetermined address is reached. This can further reduce the time required for each-bit verification and weak programming. However, to clarify the difference in writing condition during sample writing, the step-up writing is not executed.

[Eighth Embodiment]

The step-up writing employed in the seventh embodiment is a method for stepping up the gate voltage applied to each cell in each weak programming operation until a certain address passes the verify test. If the gate voltage is too high in this method, it is possible that over-programming will occur in which the cell threshold value extremely increases after one weak programming operation. To avoid this, it is necessary to set a predetermined upper limit for the gate voltage.

Since, however, the writing speed greatly varies depending upon the temperature condition, the following problem will occur. Where at a high writing speed condition (i.e. at a low temperature), a relatively low upper limit is set for the gate voltage so that no over-programming will occur, the writing period will be extremely long if writing is executed at a low-writing-speed temperature condition (i.e. at a high temperature). On the other hand, where at a low-writing-speed temperature condition, a high upper limit is set for the gate voltage so that the writing period can fall within a predetermined period, over-programming may occur when writing is executed at a high-writing-speed temperature condition.

An eighth embodiment, which is contrived as a countermeasure against the above, will be described.

First, a plurality of cells to be subjected to writing are divided into two groups. Sample writing is executed for the group which includes a smaller number of cells. During this writing, the upper limit of the gate voltage set by the step-up operation is set at a low value so that no over-programming will occur even at a slow-writing-speed temperature condition. During sample writing, the number of application pulses (the number of weak programming operations) is counted.

Subsequently, the upper gate voltage to be used during main writing is set in accordance with the number of pulses counted during sample writing. Main writing is executed on the remaining cells.

The weak programming controller and the regulator employed in the eighth embodiment will be described.

Figure 28A:
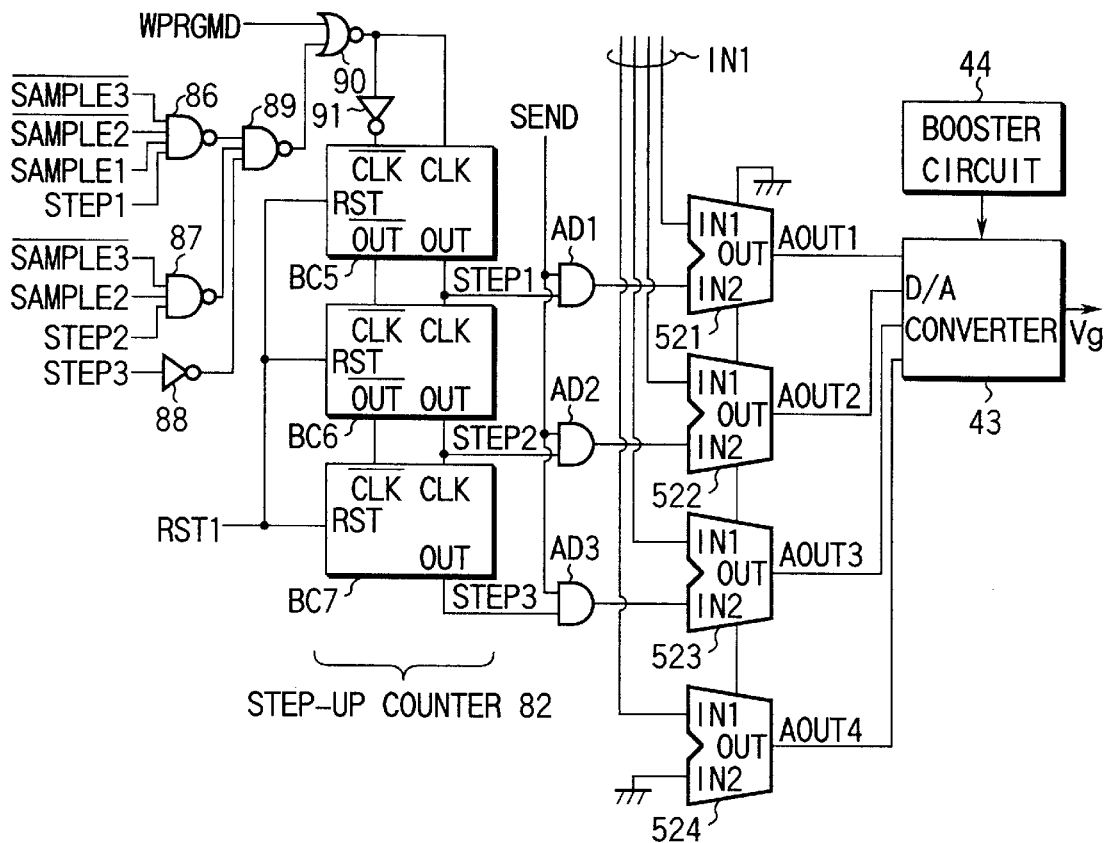
FIGS. 28A and 28B are circuit diagrams illustrating a weak programming controller and a regulator incorporated in an eighth embodiment of the invention.
Figure 28B:
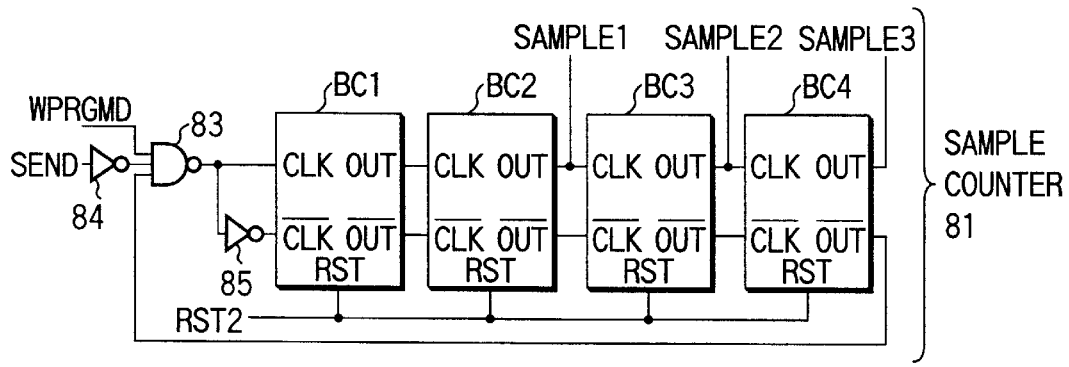

FIGS. 28A and 28B are circuit diagrams showing the structures of the weak programming controller and the regulator employed in the eighth embodiment.

As shown, the weak programming controller comprises a sample counter 81 having divider circuits BC1–BC4 arranged in stages, a step-up counter 82 having divider circuits BC5–BC7 arranged in stages, AND gates AD1–AD3 for providing the AND of the respective outputs of the step-up counter 82 and a sample end signal SEND, and adders 521–524 for adding a signal IN1 to the respective outputs of the AND gates. Further, the regulator includes a D/A converter 43, which receives a boosted potential from a booster circuit 44.

A NAND gate 83 has a first input terminal supplied with a weak programming signal WPRGMD, a second input terminal supplied with the sample end signal SEND via an inverter 84, and a third input terminal supplied with the output of the /OUT terminal of the divider circuit BC4. The output of the NAND gate 83 is input to the CLK terminal of the divider circuit BC1, and also to the /CLK terminal of the divider circuit BC1 via an inverter 85.

The sample counter 81 counts the number of weak programming operations executed during sample writing, thereby outputting signals SAMPLE1–SAMPLE3 corresponding to the number of weak programming operations, through the output terminals OUT of the divider circuits BC2–BC4.

The signals SAMPLE1–SAMPLE3, signals obtained by inverting these signals, or the outputs STEP1–STEP3 of the OUT terminals of the divider circuits BC5–BC7 are input to NAND gates 86 and 87 and an inverter 88 as shown in FIG. 28A. The outputs of the NAND gates 86 and 87 and the inverter 88 are input to a NAND gate 89. The output of the NAND gate 89 is input to a first input terminal of a NOR gate 90, and the weak programming signal WPRGMD is input to a second output terminal of the NOR gate 90. The output of the NOR gate 90 is input to the CLK terminal of the divider circuit BC5, and also to the /CLK terminal of it via an inverter 91.

The step-up counter 82 counts the number of weak programming operations executed during main writing, and outputs the signals STEP1–STEP3 corresponding to the number of weak programming operations, through the OUT terminals of the divider circuits BC5–BC7.

The signals STEP1–STEP3 indicating an increase in gate voltage during main writing, and the lowest gate voltage for weak programming, i.e. the input signal IN1 as the gate voltage used during sample writing, are input to the adders 521–524. Signals AOUT1–AOUT4 output from the adders 521–524 are input to the D/A converter 43. If the relationship between the input and output of the D/A converter 43 is set in advance, the gate voltage Vg can be output, which is increased by the step-up amount $\Delta Vg$ set in accordance with the signals AOUT1–AOUT4 output from the adders 521–524. In the circuit shown in FIG. 24, the AND gates AD1–AD3 are provided so as not to reflect an increase in gate voltage during sample writing.

When in the circuit constructed as above, the output of the NAND gate 89, which is input to the first input terminal of the NOR gate 90, is "H", the output of the circuit is always "L" irrespective of the weak programming signal WPRGMD. Thus, the upper limit of the gate voltage is set by stopping the counting of the number of weak programming operations.

Figure 29A:
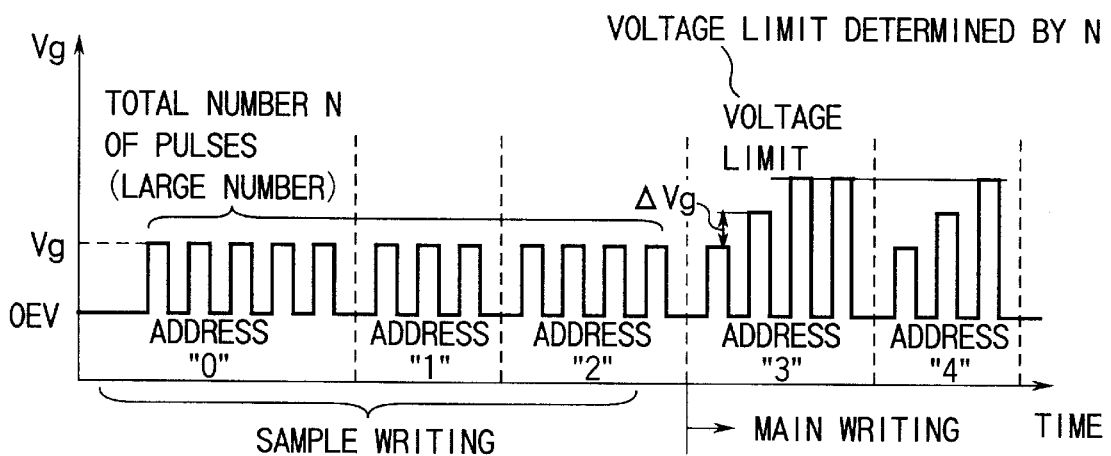
FIGS. 29A and 29B are views showing changes in gate voltage Vg in weak programming performed in the eighth embodiment of the invention.
Figure 29B:
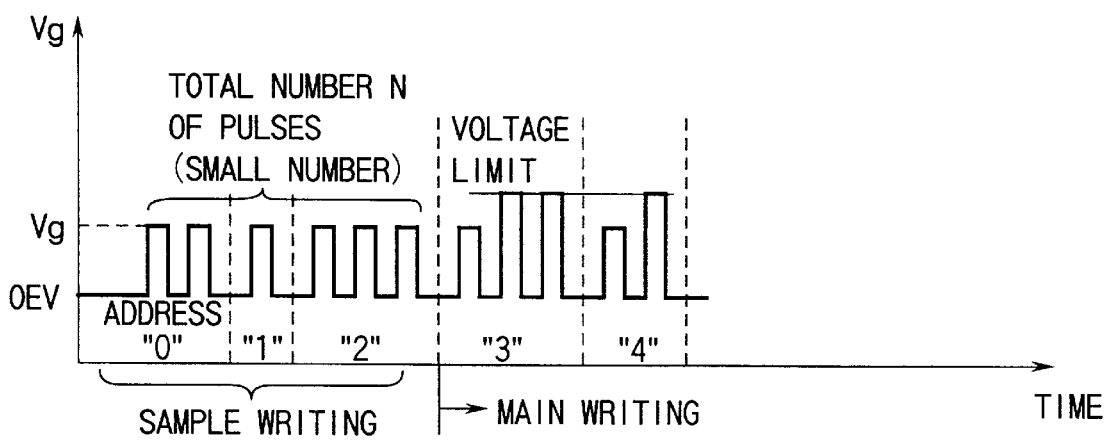

FIGS. 29A and 29B show the waveforms of the gate voltage in the eighth embodiment.

As described above, in the eighth embodiment, the time required for each-bit verification and weak programming can be reduced as in the seventh embodiment, and over-programming can be prevented.

Although in the eighth embodiment, the gate voltage is fixed during sample writing, it may be stepped up during sample writing. Further, the eighth embodiment can be combined with the seventh embodiment so as to simultaneously vary, during main writing, the step-up voltage initial value, the step-up amount of the gate voltage (an increase in gate voltage), and the upper limit of the gate voltage.

[Ninth Embodiment]

In each of the above-described embodiments, the gate voltage Vg used during main writing is optimized in accordance with the total number N of writing pulses (the number of weak programming operations) generated during sample writing. The gate voltage Vg used during main writing, however, may be optimized in accordance with a maximum one of the numbers of writing pulses generated for respective cells during sample writing. In other words, a maximum one of the numbers of writing pulses generated for respective addresses during sample writing is stored, an optimal gate voltage Vg used during main writing is set in accordance with the stored maximum number of writing pulses.

Since in this method, writing pulses generated for a cell in which the writing speed is slowest are counted, it is very disadvantageous if cells that have significantly different threshold values exist. This is because if in the above method, cells having significantly different threshold values exist, it is possible that the set gate voltage Vg will be inappropriate to some of the cells and hence over-programming will occur in them. Moreover, since in the above method, the maximum one of the numbers of writing pulses generated for respective addresses is counted instead of the total number of writing pulses generated during sample writing, the number of divider circuits necessary for counting the number of pulses can be minimized, and accordingly the layout area necessary for the divider circuits can be reduced.

Although in each of the above-described embodiments, each-bit verification and weak programming are performed when executing data erasion, this method is also applicable when executing data writing. In other words, a writing result obtained after writing is executed on some bits is used for setting a writing condition for the remaining bits. In the case of data writing executed in units of one word (e.g. 16 bits), however, a less advantage is obtained than in the above-described case of executing each-bit verification and weak programming when performing data erasion in units of one block.

As described above in detail, the invention can provide a non-volatile semiconductor memory device, in which when executing data writing by sequentially selecting memory cells in a memory cell array, the time required for writing can be minimized under any optional temperature falling within an operation-guaranteed temperature range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:
   a memory cell array including a first block formed of a plurality of non-volatile memory cells and a second block formed of a plurality of non-volatile memory cells; and
   a control section for controlling a writing operation executed on the memory cells of the first block under a first writing condition, and controlling a writing operation executed on the memory cells of the second block under a second writing condition, the control section setting the second writing condition on the basis of a writing operation result obtained by executing the writing operation on the memory cells of the first block under the first writing condition.

2. A non-volatile semiconductor memory device according to claim 1, wherein the control section erases data in memory cells included in the memory cell array, then verifies whether or not data remains in each of the data-erased memory cells, and executes writing in units of one memory cell for reducing a range of distribution of the threshold values of the memory cells, and verification as to whether or not data written into each memory cell during the execution of the writing is desired one.

3. A non-volatile semiconductor memory device according to claim 1, wherein the control section executes writing on each of memory cells corresponding to each address while changing addresses from one to another, the control section simultaneously executing verification on each of the memory cells as to whether or not data written into said each memory cell by the writing is desired one, and executing, if the written data is not the desired one, step-up writing in which a voltage applied to each memory cell is stepped up, the control section executing the writing with the voltage set at a first value until a predetermined address is reached, and executing the step-up writing after the predetermined address, with the voltage first set at a second value, and stepped up each time one step-up writing operation is performed.

4. A non-volatile semiconductor memory device according to claim 1, wherein the control section executes writing on each of memory cells corresponding to each address while changing addresses from one to another, the control section simultaneously executing verification on each of the memory cells as to whether or not data written into said each memory cell by the writing is desired one, and executing, if the written data is not the desired one, step-up writing in which a voltage applied to each memory cell is stepped up, the control section executing the step-up writing until a predetermined address is reached, with the voltage first set at a first value, and stepped up each time one step-up writing operation is performed, the control section executing the step-up writing after the predetermined address, with the voltage first set at a second value, and stepped up each time one step-up writing operation is performed.

5. A non-volatile semiconductor memory device according to claim 4, wherein the control section sets, at a first upper limit, an upper limit of the voltage applied during the step-up writing until the predetermined address is reached, and sets the upper limit at a second upper limit after the predetermined address.

6. A non-volatile semiconductor memory device according to claim 1, wherein the control section executes writing on each of memory cells corresponding to each address while changing addresses from one to another, the control section simultaneously executing verification on each of the memory cells as to whether or not data written into said each memory cell by the writing is desired one, and executing, if the written data is not the desired one, step-up writing in which a voltage applied to each memory cell is stepped up, the control section executing the writing with the voltage set at a first value until a predetermined address is reached, and executing the step-up writing after the predetermined address, with the voltage first set at the first value, and stepped up each time one step-up writing operation is executed.

7. A non-volatile semiconductor memory device according to claim 1, wherein the control section executes writing on each of memory cells corresponding to each address while changing addresses from one to another, the control section simultaneously executing verification on each of the memory cells as to whether or not data written into said each memory cell by the writing is desired one, and executing, if the written data is not the desired one, step-up writing in which a voltage applied to each memory cell is stepped up, the control section executing the step-up writing until a predetermined address is reached, with the voltage first set at a first value, and stepped up by a first amount each time one step-up writing operation is performed, the control section executing the step-up writing after the predetermined address, with the voltage first set at the first value, and stepped up by a second amount each time one step-up writing operation is performed.

8. A non-volatile semiconductor memory device according to claim 7, wherein the control section sets, at a first upper limit, an upper limit of the voltage applied during the step-up writing until the predetermined address is reached, and sets the upper limit at a second upper limit after the predetermined address.

9. A non-volatile semiconductor memory device comprising:
a memory cell array including a first block formed of a plurality of non-volatile memory cells, and a second block formed of a plurality of non-volatile memory cells; and
a control section for controlling a writing operation that includes writing executed on the memory cells of the first block under a first writing condition and on the memory cells of the second block under a second writing condition, the writing operation also including verification of writing executed on the memory cells of the first and second blocks, the control section setting the second writing condition on the basis of a sum of time periods required for the writing and the verification of writing executed on the memory cells of the first block the verification of writing being a reading operation for verifying whether data written during the writing executed on the memory cells of the first block is maintained as desired data.

10. A non-volatile semiconductor memory device according to claim 9, wherein the control section has a binary counter consisting of divider circuits arranged in stages, the time period required for writing on all memory cells of the first group being calculated by counting a number of writing operations, using the binary counter.

11. A non-volatile semiconductor memory device according to claim 10, wherein a number of the memory cells of the first group is expressed as 2 to the power of n (n=a positive integer), thereby enabling expression of an average number of writing operations for each memory cell by upper bits of an output of the binary counter.

12. A non-volatile semiconductor memory device according to claim 9, wherein the control section has an adder circuit and a voltage converting circuit, the adder circuit adding a signal indicating a writing voltage applied to the memory cells of the first group, to a signal indicating a number of writing operations executed on the memory cells of the first group, the voltage converting circuit supplying the memory cells of the second group with a writing voltage corresponding to an output of the adder circuit.

13. A non-volatile semiconductor memory device according to claim 12, wherein the control section has a first binary counter counting a number of writing operations executed on the memory cells of the first group, the first binary counter outputting a signal indicating the number of writing operations.

14. A non-volatile semiconductor memory device according to claim 13, wherein the control section has a count control circuit including a second binary counter counting a number of writing operations executed on the memory cells of the second group, the count control circuit receiving the output of the first binary counter, and an output of the second binary counter, which indicates the number of writing operations executed on the memory cells of the second group, the count control circuit creating a signal indicating an increase in writing voltage applied to the memory cells of the second group, on the basis of the outputs of the first and second binary counters.

15. A non-volatile semiconductor memory device according to claim 9, wherein the control section executes writing on each of memory cells corresponding to each address while changing addresses from one to another, the control section simultaneously executing verification on each of the memory cells as to whether or not data written into said each memory cell by the writing is desired one, and executing, if the written data is not the desired one, step-up writing in which a voltage applied to each memory cell is stepped up, the control section executing the writing with the voltage set at a first value until a predetermined address is reached, and executing the step-up writing after the predetermined address, with the voltage first set at a second value, and stepped up each time one step-up writing operation is performed.

16. A non-volatile semiconductor memory device according to claim 9, wherein the control section executes writing on each of memory cells corresponding to each address while changing addresses from one to another, the control section simultaneously executing verification on each of the memory cells as to whether or not data written into said each memory cell by the writing is desired one, and executing, if the written data is not the desired one, step-up writing in which a voltage applied to each memory cell is stepped up, the control section executing the step-up writing until a predetermined address is reached, with the voltage first set at a first value, and stepped up each time one step-up writing operation is performed, the control section executing the step-up writing after the predetermined address, with the voltage first set at a second value, and stepped up each time one step-up writing operation is performed.

17. A non-volatile semiconductor memory device according to claim 16, wherein the control section sets, at a first upper limit, an upper limit of the voltage applied during the step-up writing until the predetermined address is reached, and sets the upper limit at a second upper limit after the predetermined address.

18. A non-volatile semiconductor memory device according to claim 9, wherein the control section executes writing on each of memory cells corresponding to each address while changing addresses from one to another, the control section simultaneously executing verification on each of the memory cells as to whether or not data written into said each memory cell by the writing is desired one, and executing, if the written data is not the desired one, step-up writing in which a voltage applied to each memory cell is stepped up, the control section executing the writing with the voltage set at a first value until a predetermined address is reached, and executing the step-up writing after the predetermined address, with the voltage first set at the first value, and stepped up each time one step-up writing operation is executed.

19. A non-volatile semiconductor memory device according to claim 9, wherein the control section executes writing on each of memory cells corresponding to each address while changing addresses from one to another, the control section simultaneously executing verification on each of the memory cells as to whether or not data written into said each memory cell by the writing is desired one, and executing, if the written data is not the desired one, step-up writing in which a voltage applied to each memory cell is stepped up, the control section executing the step-up writing until a predetermined address is reached, with the voltage first set at a first value, and stepped up by a first amount each time one step-up writing operation is performed, the control section executing the step-up writing after the predetermined address, with the voltage first set at the first value, and stepped up by a second amount each time one step-up writing operation is performed.

20. A non-volatile semiconductor memory device according to claim 19, wherein the control section sets, at a first upper limit, an upper limit of the voltage applied during the step-up writing until the predetermined address is reached, and sets the upper limit at a second upper limit after the predetermined address.

21. A non-volatile semiconductor memory device according to claim 1, wherein the writing operation executed on the memory cells of the first block by the control section includes writing and verification of writing executed on each memory cell in the first block, the verification of writing being a reading operation for verifying whether or not data written during the writing executed on each of the memory cells of the first block is maintained as desired data.

22. A non-volatile semiconductor memory device according to claim 21, wherein the writing operation executed on the memory cells of the second block by the control section includes writing and verification of writing executed on each memory cell in the second block, the verification of writing being a reading operation for verifying whether or not data written during the writing executed on each of the memory cells of the second block is maintained as desired data.

23. A non-volatile semiconductor memory device according to claim 1, wherein the writing operation executed by the control section includes an erasure operation for erasing data.

24. A non-volatile semiconductor memory device according to claim 9, wherein the writing operation executed by the control section includes an erasure operation for erasing data.

* * * * *